US009100606B2

(12) United States Patent
Sato et al.

(10) Patent No.: US 9,100,606 B2
(45) Date of Patent: Aug. 4, 2015

(54) IMAGING ELEMENT, CONTROL METHOD, AND IMAGING APPARATUS

(71) Applicant: Sony Corporation, Tokyo (JP)

(72) Inventors: Mamoru Sato, Kanagawa (JP); Masaki Sakakibara, Kanagawa (JP); Tadayuki Taura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/356,011

(22) PCT Filed: Nov. 30, 2012

(86) PCT No.: PCT/JP2012/081053
§ 371 (c)(1),
(2) Date: May 2, 2014

(87) PCT Pub. No.: WO2013/084809
PCT Pub. Date: Jun. 13, 2013

(65) Prior Publication Data
US 2014/0313385 A1    Oct. 23, 2014

(30) Foreign Application Priority Data

Dec. 8, 2011   (JP) ................................ 2011-268896

(51) Int. Cl.
*H03M 1/56* (2006.01)
*H04N 5/378* (2011.01)
(Continued)

(52) U.S. Cl.
CPC ................. *H04N 5/378* (2013.01); *H03M 1/56* (2013.01); *H04N 5/3745* (2013.01); *H03M 1/124* (2013.01); *H04N 5/355* (2013.01); *H04N 5/363* (2013.01)

(58) Field of Classification Search
CPC ... H04N 5/378; H04N 5/3745; H04N 5/5363; H03M 1/56; H03M 1/124
USPC .......................... 341/155, 144, 170, 122, 118
See application file for complete search history.

(56) References Cited

U.S. PATENT DOCUMENTS 7,671,317 B2 *   3/2010   Shimomura et al. ........ 250/208.1
8,354,630 B2 *   1/2013   Hoshino ................... 250/214 R
(Continued)

FOREIGN PATENT DOCUMENTS

JP    2010-251957    11/2010
JP    2010-252140    11/2010
(Continued)

OTHER PUBLICATIONS

International Search Report; International Application No. PCT/JP2012/081053; Date of the actual completion of the International Search: Dec. 27, 2012. (Form PCT/ISA/210).
(Continued)

*Primary Examiner* — Peguy Jean Pierre
(74) *Attorney, Agent, or Firm* — Fishman Stewart Yamaguchi PLLC

(57) ABSTRACT

An imaging apparatus according to the present disclosure includes a plurality of comparing units that compare analog signals supplied from pixels including photoelectric conversion elements through a vertical signal line with reference signals of ramp waves having different inclinations and output comparison results, a plurality of counters that execute counts until the comparison results are inverted for the different comparing units and output count values as digital data, and a sample-and-hold unit that electrically disconnects the vertical signal line and the comparing units and supplies the held analog signals to the comparing units while the comparing units execute the comparisons. The present disclosure can be applied to an imaging element, a control method, and an imaging apparatus.

19 Claims, 23 Drawing Sheets

(51) Int. Cl.
*H04N 5/3745* (2011.01)
*H03M 1/12* (2006.01)
*H04N 5/363* (2011.01)
*H04N 5/355* (2011.01)

(56) References Cited

U.S. PATENT DOCUMENTS

| | | | |
|---|---|---|---|
| 8,735,796 B2 * | 5/2014 | Shimizu et al. | 250/208.1 |
| 2010/0259660 A1 | 10/2010 | Kukita | |
| 2010/0265374 A1 | 10/2010 | Nishi | |
| 2010/0315540 A1 | 12/2010 | Hoshino | |
| 2011/0037868 A1 | 2/2011 | Ota | |

FOREIGN PATENT DOCUMENTS

| | | |
|---|---|---|
| JP | 2010-288218 | 12/2010 |
| JP | 2011-035689 | 2/2011 |
| JP | 2011-041091 | 2/2011 |

OTHER PUBLICATIONS

Written Opinion of the International Searching Authority; International Application No. PCT/2012/081053; Dated: Jan. 15, 2013. (Form PCT/ISA/220 and PCT/ISA/237).

* cited by examiner

IMAGING ELEMENT, CONTROL METHOD, AND IMAGING APPARATUS

TECHNICAL FIELD

The present disclosure relates to an imaging element, a control method, and an imaging apparatus and particularly, to an imaging element, a control method, and an imaging apparatus that enable an image of a higher image quality to be obtained.

BACKGROUND ART

Recently, with the evolution of a display technique, imaging of a high image quality has been demanded increasingly for a semiconductor imaging element. Space resolution is improved by increasing the number of imaging pixels and time resolution is improved by a high-speed imaging (high frame rate) operation. In addition, color reproducibility or a correction effect is increased by increasing the number of output bits per pixel (increasing a gradation).

In an analog/digital (A/D) conversion operation in a complementary metal oxide semiconductor (CMOS) image sensor, an A/D converter of a time integration type using a ramp waveform as a reference voltage has been widely used. The A/D converter of the time integration type is superior in linearity or a noise characteristic. A plurality of A/D converters are arranged for each pixel column and execute A/D conversions at the same time, so that an operation frequency of each A/D converter can be decreased. In addition, the A/D converters arranged for each pixel column can share a reference voltage generator with each other. Therefore, area/power efficiency is superior and compatibility with a CMOS image sensor is superior as compared with other A/D conversion methods.

However, in the case of the A/D conversion of the time integration type, a gradation increase and a conversion speed are in a trade-off relation. Therefore, it is necessary to sacrifice a frame rate to increase a bit gradation of output data.

Therefore, a method of connecting a plurality of comparators to one pixel vertical signal line, executing a comparison with a plurality of reference voltages at the same time, and improving a frame rate has been considered (for example, refer to Patent Document 1).

In addition, a method of dividing an input (intensity of light) for an imaging element into a plurality of sections, setting an inclination of an output, and operating a plurality of linear A/D converters in parallel at the same time, in nonlinear compression of a RAW image in which data is compressed without generating an unnatural gradation, has been considered.

CITATION LIST

Patent Document

Patent Document 1: JP 2011-035689 A

SUMMARY OF THE INVENTION

Problems to be Solved by the Invention

However, in the case of the method described in Patent Document 1, it is necessary to sacrifice the number of pixels (decrease the number of pixels of an output image). Because an inclination of a ramp wave is the same, a gradation cannot be increased. In addition, noise may be generated due to an offset variation of the reference voltage and the image quality of the output image may be deteriorated.

In addition, in the case of the other method described above, because the plurality of comparators are connected, noise may be generated due to kickback and the image quality of the output image may be deteriorated.

The present disclosure has been made in view of the above-described circumstances and an object of the present disclosure is to obtain an image of a higher image quality.

Solutions to Problems

According to one aspect of the present disclosure, there is provided an imaging element including a plurality of comparing units that compare analog signals supplied from pixels including photoelectric conversion elements through a vertical signal line with reference signals of ramp waves having different inclinations and output comparison results, a plurality of counters that execute counts until the comparison results are inverted for the different comparing units and output count values as digital data, and a sample-and-hold unit that holds the analog signals supplied through the vertical signal line before the comparing units comparing the analog signals and the reference signals of the ramp waves other than the ramp wave having the most moderate inclination start the comparisons and electrically cuts the vertical signal line and the comparing units and supplies the held analog signals to the comparing units while the comparing units execute the comparisons.

A voltage range of the ramp wave having the most moderate inclination may be operated in a range in which kT/C noise is most dominant in the entire noise.

A counter that is selected from the plurality of counters on the basis of a comparison result of each comparing unit and executes a count for the comparing unit comparing the analog signal with a reference signal corresponding to an illuminance region according to a signal level of the analog signal may output the count value.

A counter in which a count value is largest and the comparison result of the comparing unit to which the counter corresponds is inverted may be selected from the plurality of counters.

Flag information showing a voltage range of a reference signal used by the comparator to which the selected counter corresponds may be output together with the count value.

The sample-and-hold unit may include a switch that electrically connects or cuts the vertical signal line and the comparing units and a capacitor that holds the analog signals supplied through the vertical signal line while the vertical signal line and the comparing units are electrically connected by the switch and supplies the analog signals held by the capacitor to the comparing units while the vertical signal line and the comparing units are electrically cut by the switch.

The imaging element may further include a plurality of reference signal generating units that generate the reference signals of the ramp waves having the different inclinations and the plurality of comparing units may compare the analog signals with the reference signals generated by the different reference signal generating units.

The plurality of reference signal generating units may start generation of the reference signals at the same timing.

At timing when voltage values of the ramp wave having the most moderate inclination and the ramp waves having other inclinations do not cross after the reference signal generating unit generating the reference signal of the ramp wave having the most moderate inclination generates the reference signal, the reference signal generating units generating the reference signals of the ramp waves having other inclinations may start generation of the reference signals.

At timing before the reference signal generating unit generating the reference signal of the ramp wave having the most moderate inclination generates the reference signal, the reference signal generating units generating the reference signals of the ramp waves having other inclinations may start generation of the reference signals.

While the reference signal generating unit generating the reference signal of the ramp wave having the most moderate inclination generates the reference signal, the reference signal generating units generating the reference signals of the ramp waves having other inclinations may sequentially generate the reference signals of the ramp waves having the different inclinations.

A part or all of the plurality of comparing units may compare the analog signals with the reference signals of the ramp waves having the same inclination and the imaging element may further include an addition average unit that averages the count values output by the counters corresponding to the plurality of comparing units comparing the analog signals with the reference signals of the ramp waves having the same inclination.

According to one aspect of the present disclosure, there is provided a control method of an imaging element including causing a plurality of comparing units to compare analog signals supplied from pixels including photoelectric conversion elements through a vertical signal line with reference signals of ramp waves having different inclinations and output comparison results, causing a plurality of counters to execute counts until the comparison results are inverted for the different comparing units and output count values as digital data, and causing a sample-and-hold unit to hold the analog signals supplied through the vertical signal line before the comparing units comparing the analog signals and the reference signals of the ramp waves other than the ramp wave having the most moderate inclination start the comparisons and electrically cut the vertical signal line and the comparing units and supply the held analog signals to the comparing units while the comparing units execute the comparisons.

According to one aspect of the present disclosure, there is provided an imaging apparatus including an imaging element having a plurality of comparing units that compare analog signals supplied from pixels including photoelectric conversion elements through a vertical signal line with reference signals of ramp waves having different inclinations and output comparison results, a plurality of counters that execute counts until the comparison results are inverted for the different comparing units and output count values as digital data, and a sample-and-hold unit that holds the analog signals supplied through the vertical signal line before the comparing units comparing the analog signals and the reference signals of the ramp waves other than the ramp wave having the most moderate inclination start the comparisons and electrically cuts the vertical signal line and the comparing units and supplies the held analog signals to the comparing units while the comparing units execute the comparisons, an image processing unit that executes image processing on digital data of an imaging image output from the imaging element, and a storage unit that stores the digital data of the imaging image subjected to the image processing by the image processing unit.

According to another aspect of the present disclosure, there is provided an imaging element including a plurality of reference signal generating units that generate reference signals of ramp waves having different inclinations at different timings, a plurality of comparing units that compare analog signals supplied from pixels including photoelectric conversion elements through a vertical signal line with the reference signals generated by the different reference signal generating units and output comparison results, and a plurality of counters that execute counts until the comparison results are inverted for the different comparing units and output count values as digital data.

At timing when voltage values of the ramp wave having the most moderate inclination and the ramp waves having other inclinations do not cross after the reference signal generating unit generating the reference signal of the ramp wave having the most moderate inclination generates the reference signal, the reference signal generating units generating the reference signals of the ramp waves having other inclinations may start generation of the reference signals.

At timing before the reference signal generating unit generating the reference signal of the ramp wave having the most moderate inclination generates the reference signal, the reference signal generating units generating the reference signals of the ramp waves having other inclinations may start generation of the reference signals.

Flag information showing a voltage range of a reference signal used by the comparator to which the selected counter corresponds may be output together with the count value.

According to another aspect of the present disclosure, there is provided a control method of an imaging element including causing a plurality of reference signal generating units to generate reference signals of ramp waves having different inclinations at different timings, causing a plurality of comparing units to compare analog signals supplied from pixels including photoelectric conversion elements through a vertical signal line with the reference signals generated by the different reference signal generating units and output comparison results, and causing a plurality of counters to execute counts until the comparison results are inverted for the different comparing units and output count values as digital data.

According to another aspect of the present disclosure, there is provided an imaging apparatus including an imaging element having a plurality of reference signal generating units that generate reference signals of ramp waves having different inclinations at different timings, a plurality of comparing units that compare analog signals supplied from pixels including photoelectric conversion elements through a vertical signal line with the reference signals generated by the different reference signal generating units and output comparison results, and a plurality of counters that execute counts until the comparison results are inverted for the different comparing units and output count values as digital data, an image processing unit that executes image processing on digital data of an imaging image output from the imaging element, and a storage unit that stores the digital data of the imaging image subjected to the image processing by the image processing unit.

In one aspect of the present disclosure, the analog signals supplied from the pixels including the photoelectric conversion elements through the vertical signal line are compared with the reference signals of the ramp waves having the different inclinations and the comparison results are output. The counts are executed until the comparison results are inverted for the different comparing units and the count values are output as the digital data. The analog signals supplied through the vertical signal line are held before the comparing units comparing the analog signals and the reference signals of the ramp waves other than the ramp wave having the most moderate inclination start the comparisons and the vertical signal line and the comparing units are electrically cut and the held analog signals are supplied to the comparing units while the comparing units execute the comparisons.

In another aspect of the present disclosure, the reference signals of the ramp waves having the different inclinations are generated at the different timings. The analog signals supplied from the pixels including the photoelectric conversion elements through the vertical signal line are compared with the reference signals generated by the different reference signal generating units and the comparison results are output. The counts are executed until the comparison results are inverted for the different comparing units and the count values are output as the digital data.

Effects of the Invention

According to the present disclosure, an object can be imaged. In particular, an image of a higher image quality can be obtained.

MODES FOR CARRYING OUT THE INVENTION

The following is a description of modes for carrying out the present technique (hereinafter referred to as the embodiments). Explanation will be made in the following order.
1. First Embodiment (Image Sensor)
2. Second Embodiment (Imaging apparatus)
3. Third Embodiment (Computer)

1. First Embodiment

A/D Conversion of Integration Type

First, analog/digital (A/D) conversion of an integration type using a ramp waveform as a reference voltage will be described. Because an A/D converter of a time integration type using the ramp waveform as the reference voltage is superior in linearity or a noise characteristic and is superior in compatibility with a complementary metal oxide semiconductor (CMOS) image sensor as compared with other A/D conversion methods, the A/D converter has been widely used in the CMOS image sensor.

In the CMOS image sensor, for example, an A/D converter (also referred to as a column analog digital converter (ADC)) is provided for each pixel column and a vertical signal line output (pixel value and the like) is subjected to A/D conversion. As such, the A/D converter (column ADC) is arranged for each pixel column, so that a plurality of A/D converters can be operated at the same time (A/D conversion of each column is executed in parallel). Therefore, an operation frequency of each A/D converter can be decreased.

In the case of the A/D converter of the time integration type, because the plurality of A/D converters arranged described above can share a reference voltage generator with each other, area/power efficiency is superior. Therefore, the A/D converter of the time integration type is suitable for the A/D converter (column ADC) for each pixel column.

However, in the case of the A/D converter of the time integration type, a gradation increase and a conversion speed are in a trade-off relation. For this reason, it is necessary to sacrifice a frame rate (decrease the frame rate) to increase a bit gradation of output data.

Figure 1:
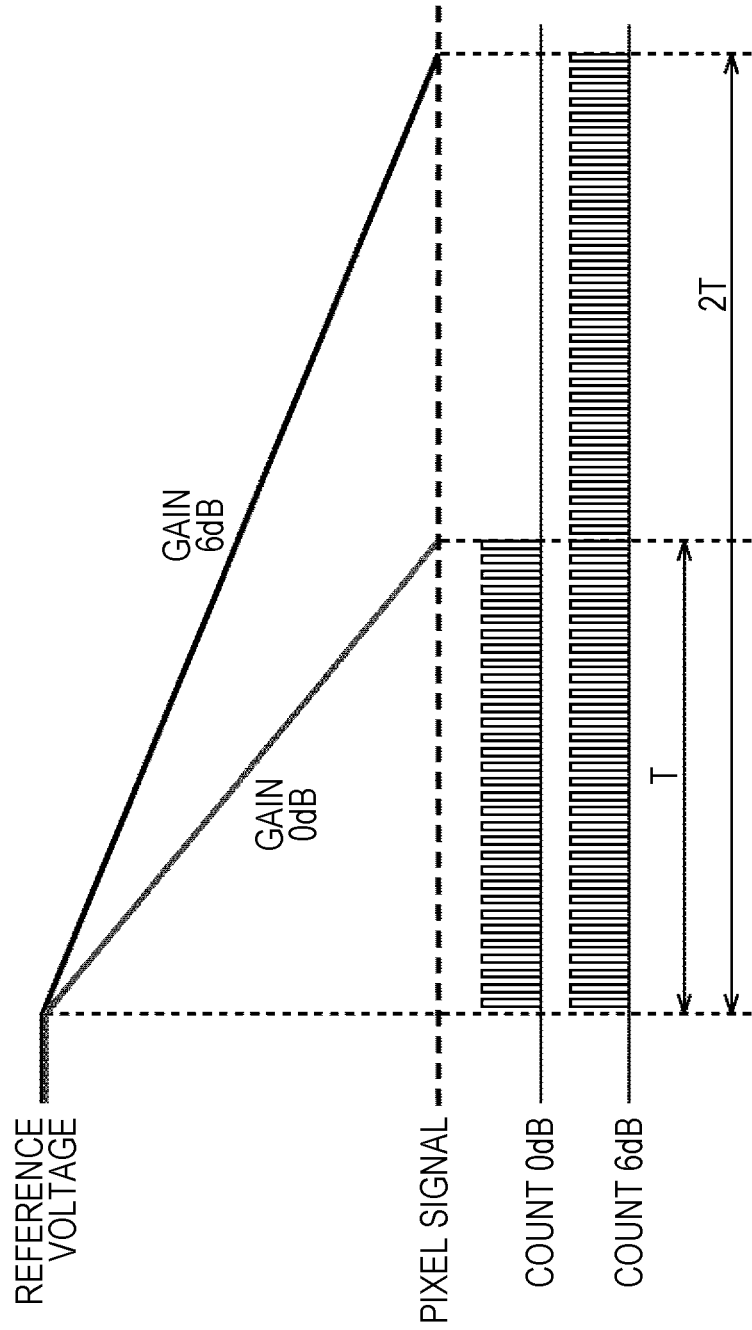
FIG. 1 is a diagram showing an example of an aspect of A/D conversion of a pixel value of a high-gradation imaging image according to the related art.

FIG. 1 shows one A/D conversion time when a sensor output is increased by one bit. It is assumed that a certain bit gradation output is compared with a ramp wave reference voltage having an inclination of a gain of 0 dB of a reference voltage generation circuit by applying a time T. In order to increase the number of output bits by 1, it is necessary to operate the gain of the reference voltage as 6 dB and set the inclination of the ramp wave of the reference voltage to ½. For this reason, a double conversion time 2T is taken to execute full-scale A/D conversion without impairing a dynamic range. As a method of increasing the number of output bits without sacrificing the frame rate, a method of increasing a count frequency is also effective. However, if reliability of an operation is considered, there is a limitation in a frequency that can be used. A method of doubling A/D converters and processing operations of the A/D converters in parallel is also considered. However, consumption power or a circuit area may be doubled.

Therefore, a method of dividing an input (intensity of light) for an imaging element into a plurality of sections, setting an inclination of an output, and operating a plurality of linear A/D converters in parallel at the same time is considered. However, in the case of this method, because the plurality of A/D converters are connected, a fluctuation of an input signal due to generation of kickback in a certain A/D converter is propagated to the A/D converters during other operations and A/D conversion becomes inaccurate. As a result, noise may be generated in an image and an image quality may be deteriorated.

Figure 2:
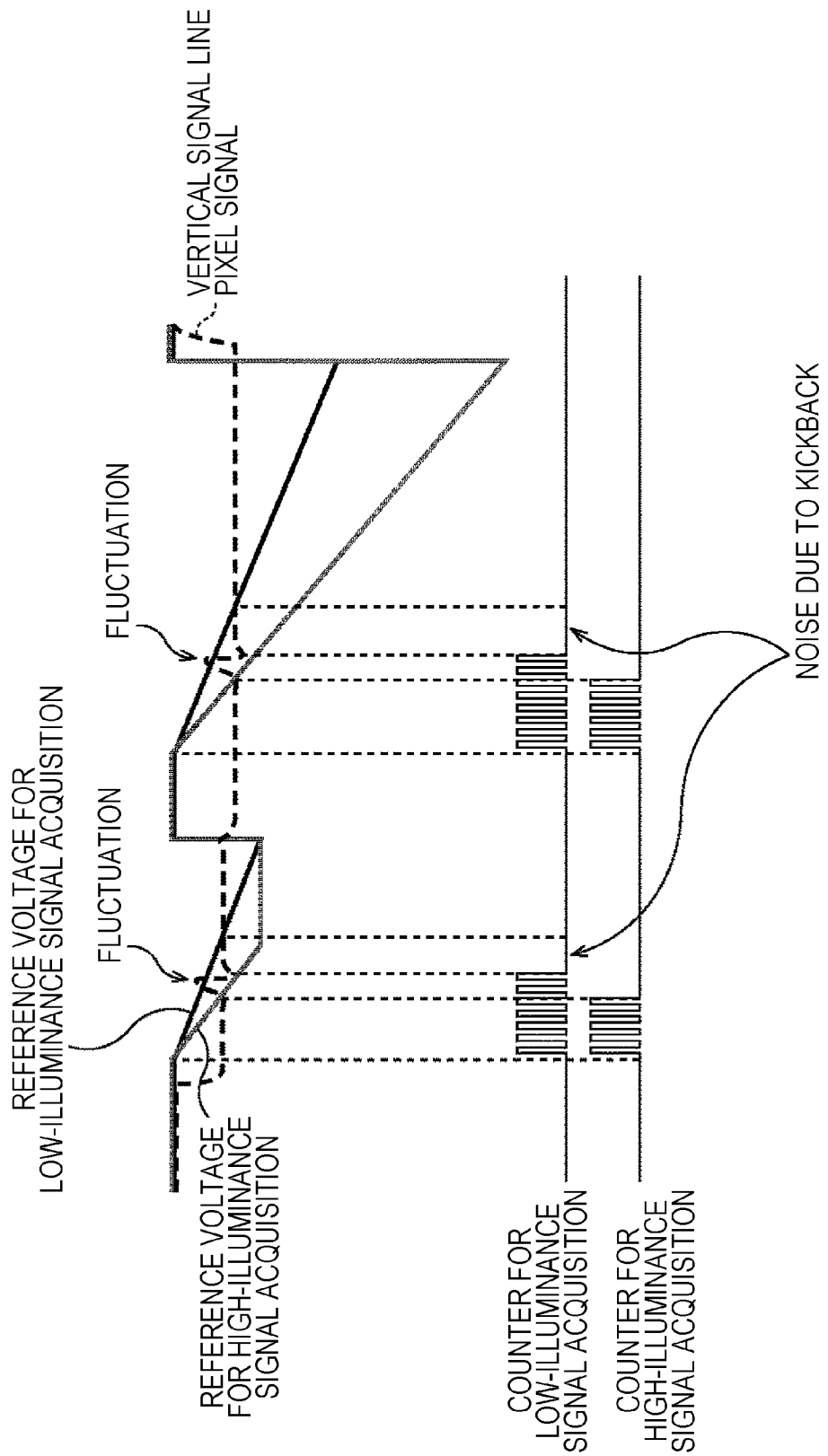
FIG. 2 is a diagram showing another example of an aspect of the A/D conversion of the pixel value of a high-gradation imaging image according to the related art.

FIG. 2 is a diagram showing an example of an aspect of generation of the noise due to the kickback. When a comparison operation starts at the same time by a plurality of ramp waves having different inclinations, pixel signal levels to be compared are the same. For this reason, a comparator of a ramp wave having a rapid inclination inverts an output earlier by all means. As shown in FIG. 2, the output inversion of the comparator is transmitted through a feedback path and a pixel signal of a pixel vertical signal line may be fluctuated.

Because a vertical signal line is shared as inputs of a plurality of comparators, the fluctuated pixel signal may affect a comparison operation with other ramp wave having a moderate inclination and may invert the comparator earlier than an ideal count value. That is, in spite of a signal being a signal that requires the most precision, the signal may be output as a signal including a large noise. In this case, because the large noise is included in a pixel signal of low illuminance in which higher precision is required, the noise in which a visual influence is large (it is highly likely to be visualized) may be included in an image and an image quality may be greatly deteriorated.

[Image Sensor]

Therefore, in the present disclosure, a technique for suppressing the noise due to the kickback from being generated will be described.

Figure 3:
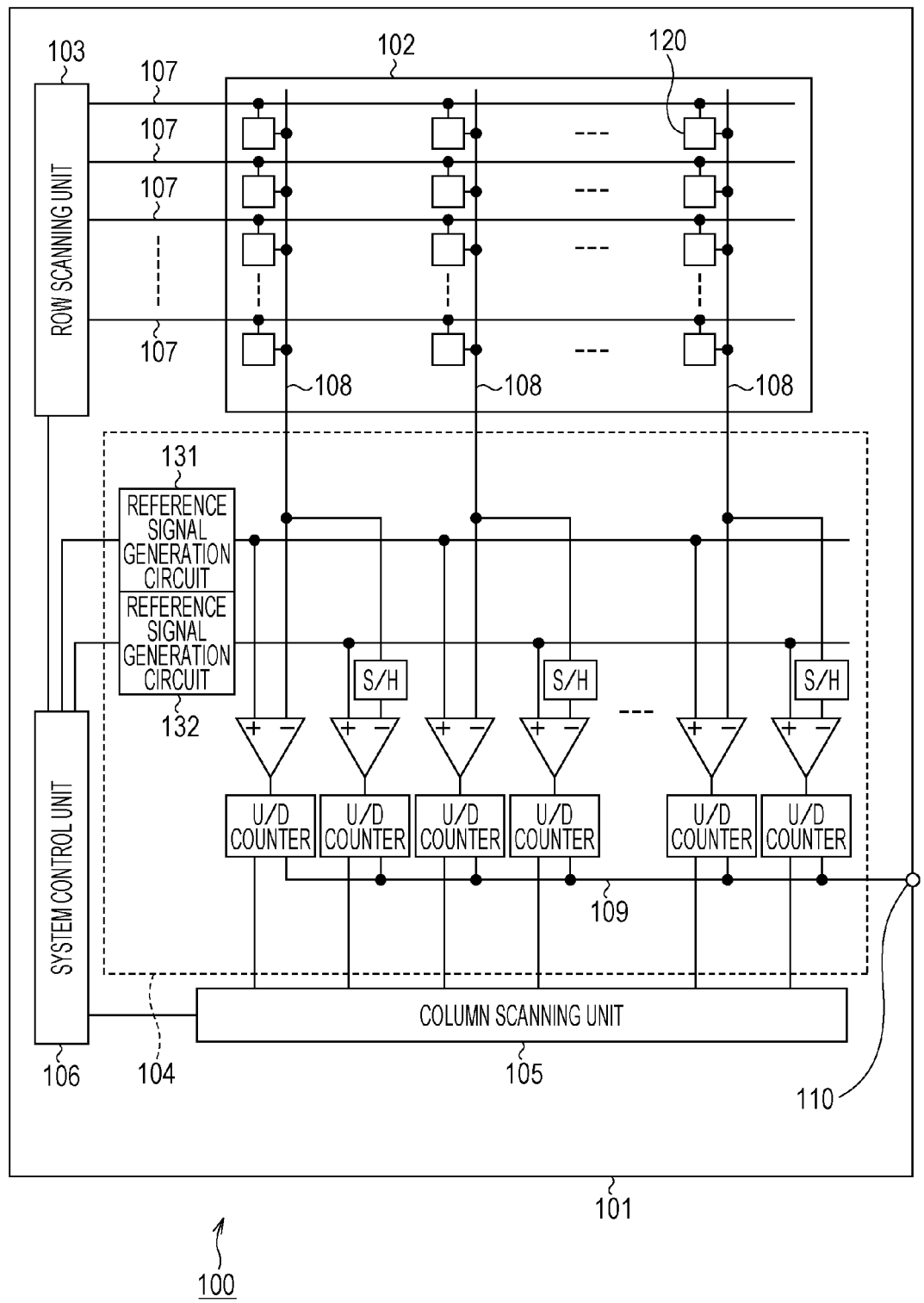
FIG. 3 is a block diagram showing a main configuration example of a CMOS image sensor.

FIG. 3 is a block diagram showing a configuration example of a part of an image sensor to which the present technique is applied. A complementary metal oxide semiconductor (CMOS) image sensor 100 shown in FIG. 3 is an imaging element that images an object and obtains digital data of an imaging image.

In the CMOS image sensor 100, a plurality of A/D converting units that execute A/D conversions using reference signals having different gradations are provided for one vertical signal line and a high-gradation A/D conversion operation is partially realized without sacrificing a frame rate.

The CMOS image sensor 100 electrically cuts a vertical signal line input of the A/D converting unit using the reference signal not having the highest gradation from other circuit during the A/D conversion and suppresses an influence of the kickback from being propagated to other A/D converting units. In this way, the CMOS image sensor 100 can suppress the noise from being generated due to the kickback.

Hereinafter, more specific description is given.

As shown in FIG. 3, the CMOS image sensor 100 includes a pixel array unit 102 that is formed on a semiconductor substrate (hereinafter, also referred to as a "chip") 101 and a peripheral circuit unit that is integrated on the same chip 101 as the pixel array unit 102. In this example, a row scanning unit 103, a column processing unit 104, a column scanning unit 105, and a system control unit 106 are provided as the peripheral circuit unit.

In the pixel array unit 102, unit pixels (hereinafter, also simply referred to as "pixels") 120 each having a photoelectric conversion element that generates optical charges of a charge amount according to an incident light amount and accumulates inside are arranged two-dimensionally in a matrix. In FIG. 3, each of squares in the pixel array unit 102 shows the pixel 120. In FIG. 3, only the pixel 120 of an upper right end among the pixels 120 arranged in the matrix is denoted by a reference numeral. However, when the pixels 120 do not need to distinguish from each other, the pixels arranged in the matrix are also called the "pixels 120".

In the pixel array unit 102, a pixel driving line 107 is provided along a horizontal direction/row direction (arrangement direction of pixels of a pixel row) for each pixel row and a vertical signal line 108 is provided along a vertical direction/column direction (arrangement direction of pixels of a pixel column) for each pixel column, with respect to the pixel arrangement of the matrix. The pixel driving line 107 transmits a driving signal to perform driving to read a signal from the pixel. In FIG. 3, each pixel driving line 107 is shown as one wiring line. However, each pixel driving line 107 is not limited to one wiring line. One end of the pixel driving line 107 is connected to an output terminal corresponding to each row of the row scanning unit 103.

The row scanning unit 103 is a pixel driving unit that is composed of a shift register or an address decoder and drives each pixel 120 of the pixel array unit 102 simultaneously for all pixels or in a row unit. A specific configuration of the row scanning unit 103 is not shown in the drawings. However, the row scanning unit 103 is generally configured to have two scanning systems of a read scanning system and a weeping scanning system.

The read scanning system selectively scans the unit pixel of the pixel array unit 102 sequentially in the row unit, to read a signal from the unit pixel. The signal read from the unit pixel is an analog signal. The sweeping scanning system performs sweeping scanning for a read row for which the read scanning has been performed by the read scanning system, a shutter speed time earlier than the read scanning.

Unnecessary charges are swept from the photoelectric conversion element of the unit pixel of the read row by the sweeping scanning by the sweeping scanning system, so that the photoelectric conversion element is reset. In addition, a so-called electronic shutter operation is executed by the sweeping (resetting) of the unnecessary charges by the sweeping scanning system. Here, the electronic shutter operation means an operation for newly starting exposure (starting accumulation of the optical charges) after abandoning the optical charges of the photoelectric conversion element.

The signal that is read by the read operation by the read scanning system corresponds to an amount of light incident after the immediately previous read operation or the electronic shutter operation. In addition, a period from read timing by the immediately previous read operation or sweeping timing by the electronic shutter operation to read timing by a current read operation becomes an accumulation period (exposure period) of the optical charges in the unit pixel.

The signal that is output from each pixel 120 of the pixel row selectively scanned by the row scanning unit 103 is supplied to the column processing unit 104 through each vertical signal line 108. The column processing unit 104 executes a predetermined signal process for the signal output from each pixel 120 of the row selected by the row scanning unit 103 through the vertical signal line 108 and temporarily stores a pixel signal after the signal process, for each pixel column of the pixel array unit 102.

Specifically, the column processing unit 104 receives the signal of the unit pixel 120 and executes a signal process, such as noise removal by correlated double sampling (CDS), signal amplification, and A/D conversion, for the signal.

A noise removal process by the CDS is executed by taking a difference of a reset level read when the unit pixel (in actuality, a floating diffusion unit to be described below) is reset and a signal level read according to signal charges subjected to photoelectric conversion by the photoelectric conversion element. By the noise removal process, reset noise or fixed pattern noise peculiar to the pixel such as a threshold variation of an amplification transistor is removed. The signal process described herein is only exemplary and is not limitative.

In the column processing unit 104, the column ADC for each pixel column is provided. The A/D conversion for each pixel column described above is executed by the column ADC. Although the detail of the column ADC is described below, the column processing unit 104 has a plurality of reference signal generation circuits. Each reference signal generation circuit generates a ramp wave as a reference signal. However, an inclination of the ramp wave that is generated by each reference signal generation circuit is different.

The column ADC has a plurality of A/D converting units for one vertical signal line, as described above. The plurality of A/D converting units use the reference signals that are generated by the different reference signal generation circuits. That is, each A/D converting unit uses a ramp wave having a different inclination. When the inclination of the ramp wave is moderate, the A/D converting unit can execute higher-gradation A/D conversion (the number of output bits can be increased). That is, the column ADC can execute the A/D conversion at a plurality of kinds of gradations.

As described above, if the inclination of the ramp wave becomes moderate, a processing time of the A/D conversion may increase. Therefore, the column ADC divides a range of values taken by a vertical signal line output into a plurality of regions (illuminance regions) and executes the high-gradation A/D conversion using the ramp wave having the moderate inclination, for only the partial illuminance regions. In general, in a small low-illuminance region of a pixel output signal, image data of higher precision is required.

Therefore, the column ADC executes highest-gradation A/D conversion using the ramp wave having the most moderate inclination, for only a lowest-illuminance region set in advance, and executes A/D conversion other than the highest-gradation A/D conversion using the ramp wave having the rapid inclination, for the entire region.

In this way, the column ADC of the column processing unit 104 can realize a high-gradation A/D conversion operation partially without sacrificing a frame rate.

In the case of the example of FIG. 3, a reference signal generation circuit 131 and a reference signal generation circuit 132 are provided as the reference signal generation circuit. The reference signal generation circuit 131 generates a reference signal used for the high-gradation A/D conversion and the reference signal generation circuit 132 generates a reference signal used for the low-gradation A/D conversion. That is, the reference signal generation circuit 131 generates a ramp wave of which the inclination is more moderate than the inclination in the reference signal generation circuit 132, as a reference signal. Each of the reference signals (ramp waves) that are generated by the reference signal generation circuit 131 and the reference signal generation circuit 132 is supplied to the corresponding A/D converting unit of each column ADC.

In the case of the example of FIG. 3, the two A/D converting units are provided for each vertical signal line. One of the two A/D converting units executes the high-gradation A/D conversion using the ramp wave having the moderate inclination generated by the reference signal generation circuit 131 and the other A/D converting unit executes the low-gradation A/D conversion using the ramp wave having the rapid inclination generated by the reference signal generation circuit 132.

The column scanning unit 105 is composed of a shift register or an address decoder and sequentially selects the unit circuit corresponding to the pixel column of the column processing unit 104. By the selective scanning by the column scanning unit 105, the pixel signal subjected to the signal process by the column processing unit 104 is sequentially output to a horizontal bus 109, is supplied to an output terminal (Vout) 110 through the horizontal bus 109, and is transmitted from the output terminal 110 to the outside of the semiconductor substrate 101 (CMOS image sensor 100).

The system control unit 106 receives a clock provided from the outside of the semiconductor substrate 101 or data to instruct an operation mode and outputs data such as internal information of the CMOS image sensor 100. The system control unit 106 further has a timing generator to generate various timing signals and executes driving control of the peripheral circuit unit such as the row scanning unit 103, the column processing unit 104, and the column scanning unit 105 directly or indirectly, on the basis of the various timing signals generated by the timing generator.

For example, the system control unit 106 controls generation of the reference signals by the reference signal generation circuit 131 and the reference signal generation circuit 132 of the column processing unit 104. In addition, for example, the system control unit 106 controls the column scanning unit 105 and controls an operation of each column ADC in the column processing unit 104.

[Pixel Configuration]

Figure 4:
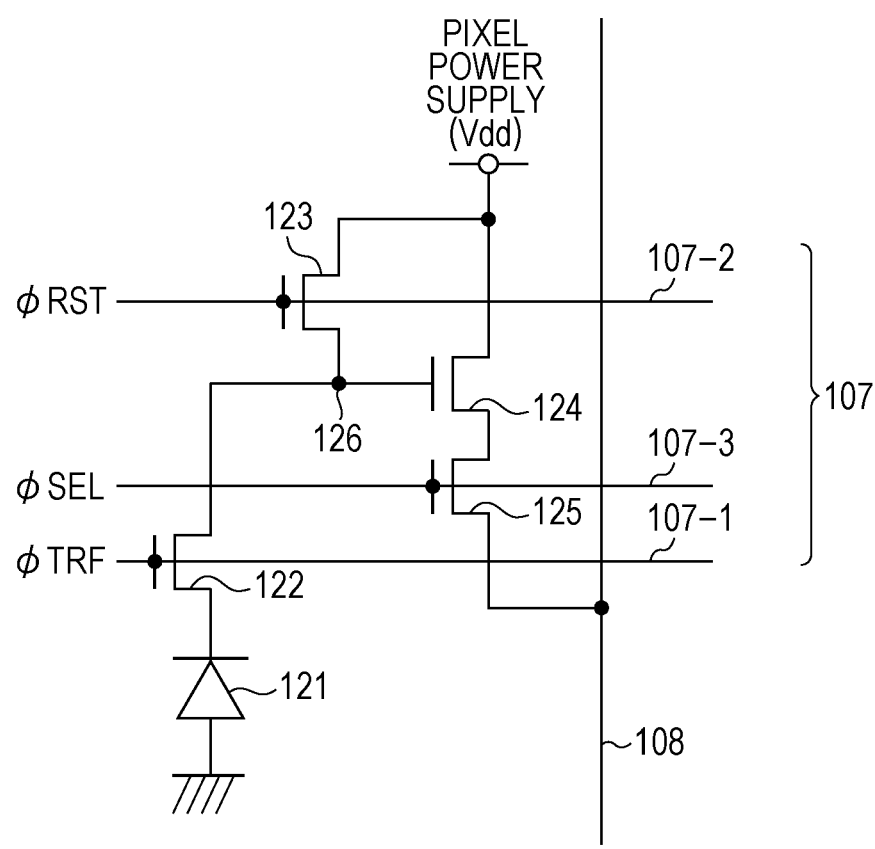
FIG. 4 is a diagram showing an example of a unit pixel configuration.

FIG. 4 is a circuit diagram showing an example of a circuit configuration of the pixel 120. As shown in FIG. 4, the pixel 120 has four transistors of a transfer transistor 122, a reset transistor 123, an amplification transistor 124, and a selection transistor 125, in addition to a photodiode 121 which serves as the photoelectric converting unit.

Here, N-channel metal oxide semiconductor (MOS) transistors are used as the four transistors (the transfer transistor 122 to the selection transistor 125). However, a conductive combination of the transfer transistor 122, the reset transistor 123, the amplification transistor 124, and the selection transistor 125 described herein is only exemplary and is not limitative.

With respect to the pixels 120, three driving wiring lines of a transfer line 107-1, a reset line 107-2, and a selection line 107-3 are provided as the pixel driving line 107 commonly to each pixel of the same pixel row. One end of the transfer line 107-1, the reset line 107-2, and the selection line 107-3 is connected to an output terminal corresponding to each pixel row of the row scanning unit 103 in a pixel row unit and the transfer line 107-1, the reset line 107-2, and the selection line 107-3 transmit a transfer pulse $\phi$TRF, a reset pulse $\phi$RST, and a selection pulse $\phi$SEL which serve as driving signals to drive the pixel 120.

An anode electrode of the photodiode 121 is connected to a negative-side power supply (for example, a ground) and the photodiode 121 executes photoelectric conversion to convert received light into optical charges (here, photoelectrons) of a charge amount according to a light amount thereof and accumulates the optical charges. A cathode electrode of the photodiode 121 is electrically connected to a gate electrode of the amplification transistor 124 through the transfer transistor 122. A node 126 that is electrically connected to the gate electrode of the amplification transistor 124 is called a floating diffusion (FD) unit.

The transfer transistor 122 is connected between the cathode electrode of the photodiode 121 and the FD unit 126. The transfer pulse φTRF in which a high level (for example, a Vdd level) is active (hereinafter, referred to as "High active") is provided to the gate electrode of the transfer transistor 122 through the transfer line 107-1. Thereby, the transfer transistor 122 is turned on and transfers the optical charges subjected to the photoelectric conversion by the photodiode 121 to the FD unit 126.

A drain electrode of the reset transistor 123 is connected to a pixel power supply Vdd and a source electrode thereof is connected to the FD unit 126. The High active reset pulse φRST is provided to the gate electrode of the reset transistor 123 through the reset line 107-2. Thereby, the reset transistor 123 is turned on and abandons the charges of the FD unit 126 to the pixel power supply Vdd to reset the FD unit 126.

A gate electrode of the amplification transistor 124 is connected to the FD unit 126 and a drain electrode thereof is connected to the pixel power supply Vdd. In addition, the amplification transistor 124 outputs the potential of the FD unit 126 after being reset by the reset transistor 123 as a reset signal (a reset level). Further, the amplification transistor 124 outputs the potential of the FD unit 126 after transmitting the signal charges by the transfer transistor 122 as a light accumulation signal (a signal level).

A drain electrode of the selection transistor 125 is connected to a source electrode of the amplification transistor 124 and a source electrode thereof is connected to the vertical signal line 108. The High active selection pulse φSEL is provided to the gate electrode of the selection transistor 125 through the selection line 107-3. Thereby, the selection transistor 125 is turned on, makes a state of the pixel 120 become a selection state, and relays a signal output from the amplification transistor 124 to the vertical signal line 108.

With respect to the selection transistor 125, a circuit configuration connected between the pixel power supply Vdd and a drain of the amplification transistor 124 can be adopted.

In addition, the configuration of the pixel 120 is not limited to the pixel configuration including the four transistors. For example, the configuration of the pixel 120 may be a pixel configuration including three transistors functioning as the amplification transistor 124 and the selection transistor 125 and a configuration of a pixel circuit thereof may be any configuration.

[Column ADC]

Figure 5:
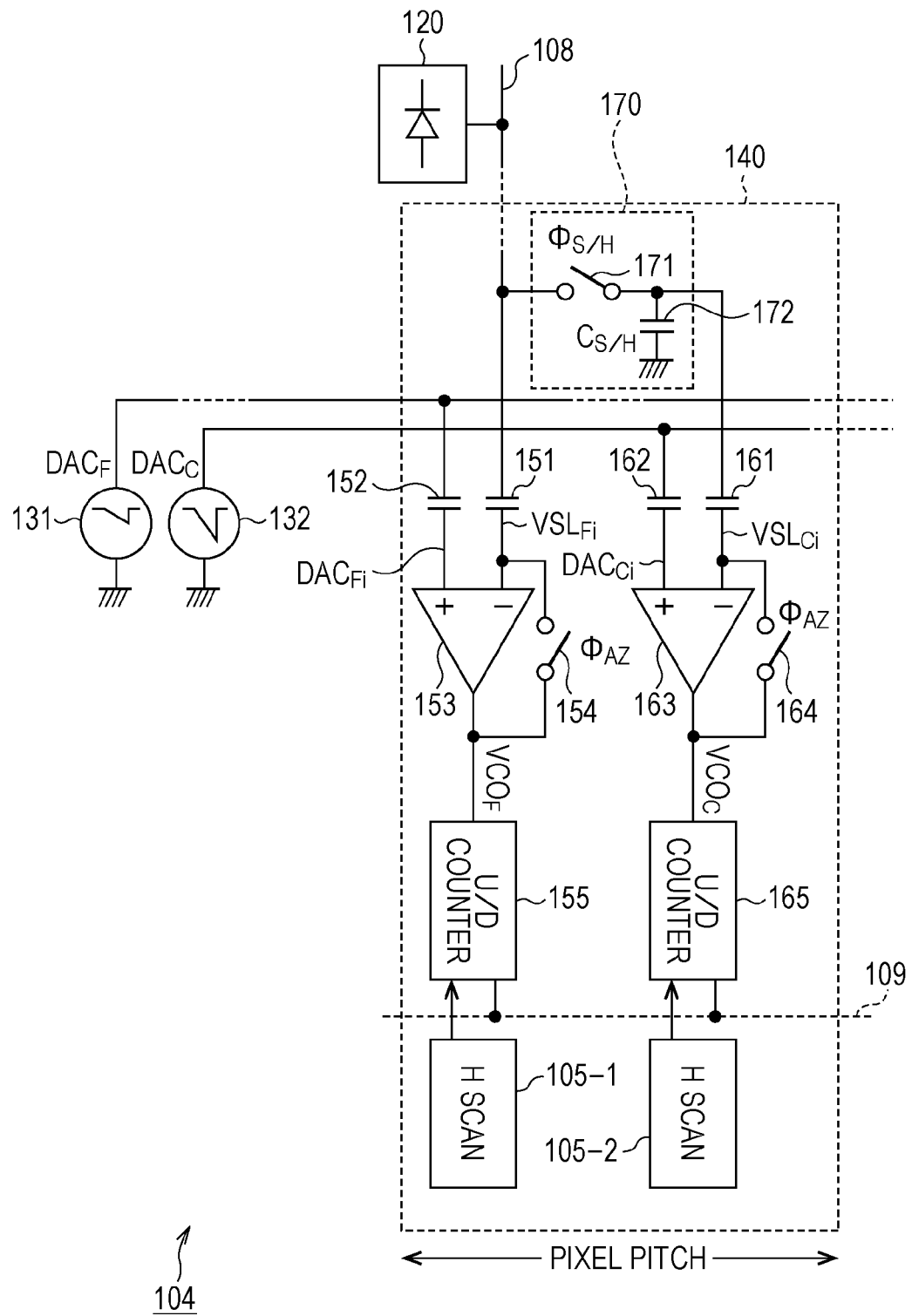
FIG. 5 is a circuit diagram showing a main configuration example of column A/D.

FIG. 5 is a block diagram showing a main configuration example of the column ADC of the column processing unit 104. The column ADC 140 shown in FIG. 5 is a configuration example that corresponds to one vertical signal line. The column ADC 140 of the configuration shown in FIG. 5 is provided for each vertical signal line.

As described above, the column ADC 140 has a plurality of A/D converting units that execute A/D conversions of different gradations. In the case of the example of FIG. 5, the column ADC 140 has two A/D converting units of an A/D converting unit executing high-gradation A/D conversion and an A/D converting unit executing low-gradation A/D conversion. In the example of FIG. 5, a left configuration of an inner portion of the column ADC 140 surrounded by a dotted-line frame is the A/D converting unit executing the high-gradation A/D conversion (also referred to as a high-gradation A/D converting unit) and a right configuration of the inner portion of the column ADC 140 is the A/D converting unit executing the low-gradation A/D conversion (also referred to as a low-gradation A/D converting unit).

That is, the high-gradation A/D converting unit has capacitors 151 and 152, a comparator 153, a switch ($\phi_{AZ}$) 154, and a U/D counter 155. The low-gradation A/D converting unit has capacitors 161 and 162, a comparator 163, a switch ($\phi_{AZ}$) 164, and a U/D counter 165. An HSCAN 105-1 and an HSCAN 105-2 are shown by schematically representing functions of the column scanning unit 105 (control signals supplied from the column scanning unit 105) for the individual A/D converting units and do not exist in the column processing unit 104 in actuality.

A signal (vertical signal line output) supplied from the pixel array unit 102 through the vertical signal line 108 is supplied to one input of the comparator 153 through the capacitor 151 ($VSL_{Fi}$). In addition, a reference signal supplied from the reference signal generation circuit 131, that is, a ramp wave having a moderate inclination is supplied to the other input of the comparator 153 through the capacitor 152 ($DAC_{Fi}$).

The comparator 153 compares both the inputs and outputs a signal showing a comparison result thereof (which one is large) thereof ($VCO_F$). The switch 154 appropriately connects the input and the output of the comparator 153, executes analog CDS, and removes an offset of the comparator 153.

The U/D counter 155 starts a count (incrementing of a count value) at a predetermined pace with the start of the comparison by the comparator 153, according to control of the HSCAN 105-1. If an output of the comparator 153 is inverted (a signal level of the ramp wave becomes smaller than the vertical signal line output) or the count value is saturated (the signal level of the ramp wave reaches a minimum value), the U/D counter 155 ends the count, holds the previous count value, and appropriately outputs the count value to the horizontal bus 109, according to the control of the HSCAN 105-1.

In this way, the high-gradation A/D converting unit executes the high-gradation A/D conversion of the low-illuminance region.

The vertical signal line output is supplied to one input of the comparator 163 through the capacitor 161 ($VSL_{Ci}$). In addition, a reference signal supplied from the reference signal generation circuit 132, that is, a ramp wave having a rapid inclination is supplied to the other input of the comparator 163 through the capacitor 162 ($DAC_{Ci}$).

The comparator 163 compares both the inputs and outputs a signal showing a comparison result thereof (which one is large) thereof ($VCO_C$). The switch 164 appropriately connects the input and the output of the comparator 163, executes analog CDS, and removes an offset of the comparator 163.

The U/D counter 165 starts a count (incrementing of a count value) at a predetermined pace with the start of the comparison by the comparator 163, according to control of the HSCAN 105-2. If the output of the comparator 163 is inverted (a signal level of the ramp wave becomes smaller than the vertical signal line output) or the count value is saturated (the signal level of the ramp wave reaches a minimum value), the U/D counter 165 ends the count, holds the previous count value, and appropriately outputs the count value to the horizontal bus 109, according to the control of the HSCAN 105-2.

In this way, the low-gradation A/D converting unit executes the low-gradation A/D conversion of the entire region.

However, as shown in FIG. 5, the column ADC 140 further has a sample-and-hold unit 170. The sample-and-hold unit 170 is provided between the vertical signal line 108 and the capacitor 161. The sample-and-hold unit 170 has a switch ($\Phi_{S/H}$) 171 and a capacitor ($C_{S/H}$) 172. The switch 171 electrically connects or cuts the vertical signal line 108 and the capacitor 161. The capacitor 172 holds the vertical signal line output.

The switch 171 is opened while the low-gradation A/D converting unit executes the A/D conversion and electrically cuts the vertical signal line 108 and the capacitor 161. In the comparator 163, from a circuit configuration, a parasitic capacity is easily generated between the input and the output, the inversion of the output affects the input side, and the signal level of the input signal may be fluctuated (the kickback may be generated).

If the fluctuation of the signal level is propagated to the high-gradation A/D side, error may be generated in a comparison result in the comparator 153. The error may become noise and may be output. With respect to this phenomenon, the switch 171 electrically cuts the vertical signal line 108 and the capacitor 161 during the A/D conversion, so that the switch can suppress the fluctuation from being propagated. That is, the switch 171 can suppress the noise due to the kickback from being generated.

However, if the vertical signal line 108 and the capacitor 161 are electrically cut, the vertical signal line output is not input to the comparator 163. Therefore, the switch 171 electrically connects the vertical signal line 108 and the capacitor 161 while the A/D conversion is not executed by the low-gradation A/D converting unit. In this way, the signal level of the vertical signal line output is accumulated in the capacitor 172. That is, after the switch 171 is cut, the signal level accumulated in the capacitor 172 is supplied to the low-gradation A/D converting unit.

As described above, the sample-and-hold unit 170 can suppress the fluctuation of the signal level due to the kickback from being propagated and can suppress the noise due to the kickback from being generated. Therefore, the column ADC 140 can partially execute the high-gradation A/D conversion while suppressing the noise due to the kickback from being generated without sacrificing the frame rate, by the simple configuration. As a result, the CMOS image sensor 100 can obtain an image of a higher image quality.

If the sample-and-hold unit 170 is added, kT/C noise may increase. However, because the high-gradation A/D converting unit executes the A/D conversion of the low-illuminance region, an A/D conversion result of the low-gradation A/D converting unit is actually adopted for only the high-illuminance region. That is, in a low-gradation output/high-illuminance-side signal, optical shot noise becomes a dominant factor of noise. Therefore, even though the kT/C noise increases, this does not greatly affect an entire amount of noise.

Accordingly, the sample-and-hold unit 170 is provided in the input of the low-gradation A/D converting unit, not the input of the high-gradation A/D converting unit, so that the noise increase can be suppressed.

The column ADC 140 having the above-described configuration should be designed to stay at a horizontal direction pitch of the pixels. However, in the case of the present technique, as described above, the sample-and-hold unit 170 having the simple configuration is only added, so that the noise due to the kickback can be suppressed from being generated. Therefore, the column ADC 140 can be realized more easily.

[Operation Example]

Figure 6:
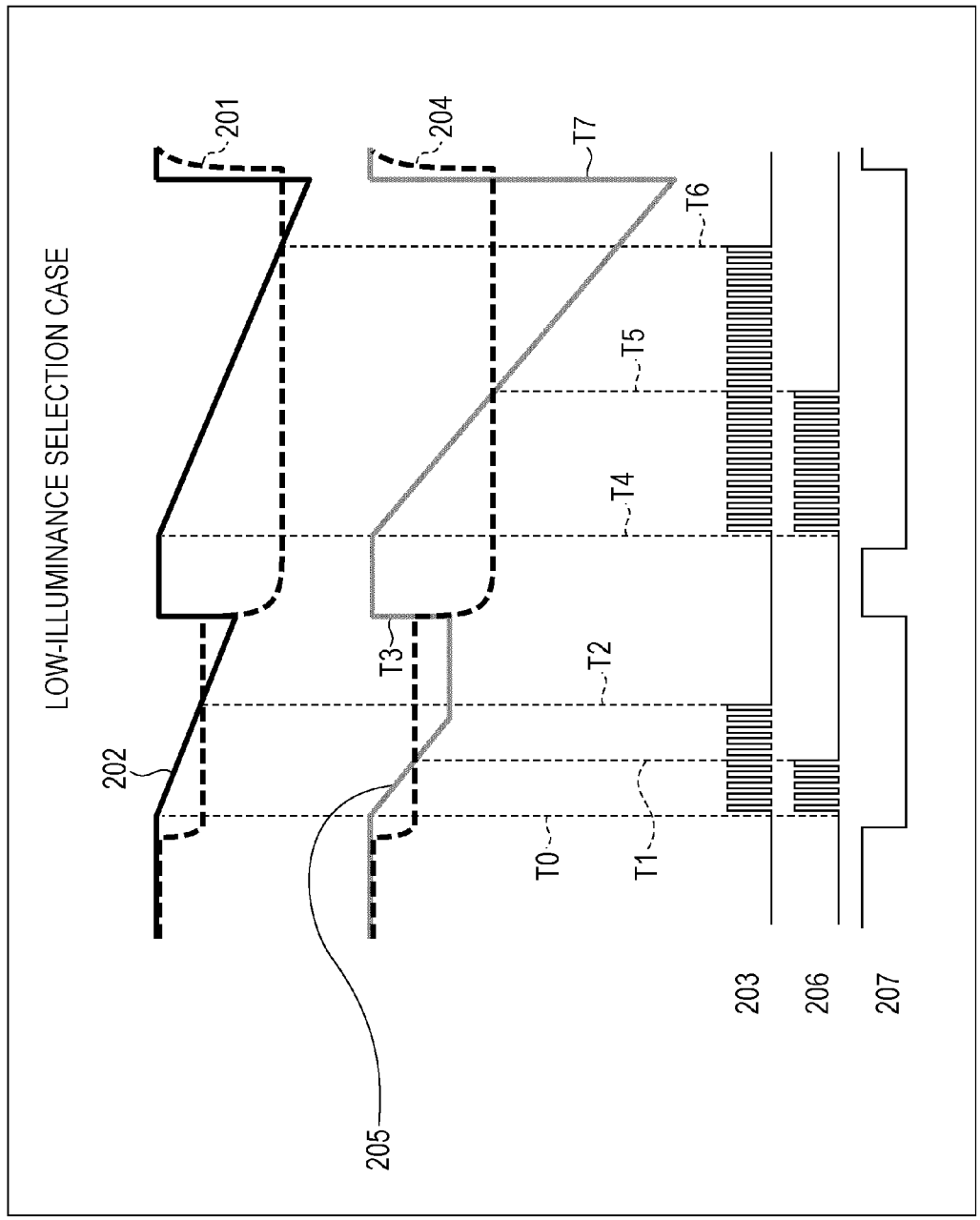
FIG. 6 is a diagram showing an example of an aspect of A/D conversion of a pixel signal.

Hereinafter, a specific operation example will be described. First, the case in which an output of the low-illuminance side is selected (the case in which a pixel value is small) will be described. FIG. 6 is a diagram showing an example of an aspect of A/D conversion of a pixel signal in the case in which the output of the low-illuminance side is selected.

At an uppermost step of FIG. 6, a vertical signal line pixel signal 201 which is a waveform of a signal (vertical signal line output) supplied from the pixel 120 to the column ADC through the vertical signal line 108 and a reference voltage 202 for low-illuminance signal acquisition which is a waveform of a ramp wave generated by the reference signal generation circuit 131 are shown. In addition, at a second step from the top of FIG. 6, an S/H circuit pixel signal 204 which is a waveform of an output signal of the sample-and-hold unit 170 and a reference voltage 205 for high-illuminance signal acquisition which is a waveform of a ramp wave generated by the reference signal generation circuit 132 are shown.

As described above, because the S/H circuit pixel signal 204 is obtained by holding the vertical signal line pixel signal 201 in the capacitor 172, a waveform of the S/H circuit pixel signal 204 becomes substantially the same waveform as the vertical signal line pixel signal 201.

At the lower side of FIG. 6, a counter 203 for low-illuminance signal acquisition showing an aspect of a count by the U/D counter 155, a counter 206 for high-illuminance signal acquisition showing an aspect of a count by the U/D counter 165, and a φS/H 207 which is a waveform of a control signal to switch ON/OFF (connecting/cutting) of the switch 171 are shown.

In this example, the digital CDS is executed to remove fixed pattern noise for each pixel. In the digital CDS, a reset voltage of the FD is previously read as a black level of the pixel in a section of times T0 to T3, a pixel signal (pixel value) of the pixel is read in a section of times T4 to T7, and the previously read black level is subtracted from a signal level of a pixel signal read thereafter.

An operation of the digital CDS is arbitrary and other operations may be executed. For example, a frame memory may be placed at a rear step and a subtraction process may be executed by the frame memory and a count value of the acquired black level may be inverted (down count) and may be up counted as an initial value of the A/D conversion of the pixel signal.

As shown in FIG. 6, before T0 when the A/D conversion for the reset voltage of the FD starts, the φS/H 207 is turned on and the switch 171 becomes a connection state (turned on). Therefore, the vertical signal line output (reset voltage of the FD) is held in the capacitor 172. If a time becomes T0, the φS/H 207 is turned off and the switch 171 becomes a cutting state (turned off). In this state, the A/D conversion for the reset voltage of the FD is executed during a period from the time T0 to the time T3. Therefore, the fluctuation of the signal level due to the kickback of the comparator 163 can be suppressed from being propagated.

Similarly, the φS/H 207 is turned on during a period from the time T3 when the A/D conversion for the reset voltage of the FD ends to a time T4 when the A/D conversion for the pixel signal starts and the switch 171 becomes a connection state (turned on). Therefore, the vertical signal line output (pixel signal level) is held in the capacitor 172. If a time becomes T4, the φS/H 207 is turned off and the switch 171 becomes a cutting state (turned off). In this state, the A/D conversion for the pixel signal is executed during a period from the time T4 to a time T7. Therefore, the fluctuation of the signal level due to the kickback of the comparator 163 can be suppressed from being propagated.

As shown in FIG. 6, at a time T5, the reference voltage 205 for the high-illuminance signal acquisition becomes smaller than the S/H circuit pixel signal 204 and an output of the comparator 163 is inverted. Therefore, as shown in a waveform of the counter 206 for the high-illuminance signal acquisition, at the time t5, the count by the U/D counter 165 ends and a count value thereof is held.

In addition, at a time T6, the reference voltage 202 for the low-illuminance signal acquisition becomes smaller than the vertical signal line pixel signal 201 and an output of the comparator 153 is inverted. Therefore, as shown in a waveform of the counter 203 for the low-illuminance signal acquisition, at the time t6, the count by the U/D counter 155 ends and a count value thereof is held.

From a plurality of digital output values, one digital output value that has a largest count value and is not saturated is selected and is output to a rear step. Because an inclination of a ramp wave of the reference voltage 205 for the high-illuminance signal acquisition is rapid, the counter 206 for the high-illuminance signal acquisition ends earlier. For this reason, when the count value of the counter 203 for the low-illuminance signal acquisition is not saturated, the count value of the counter 203 for the low-illuminance signal acquisition is large.

That is, when the count value of the counter 203 for the low-illuminance signal acquisition is not saturated, a count value of the U/D counter 155 is selected as an output.

Figure 7:
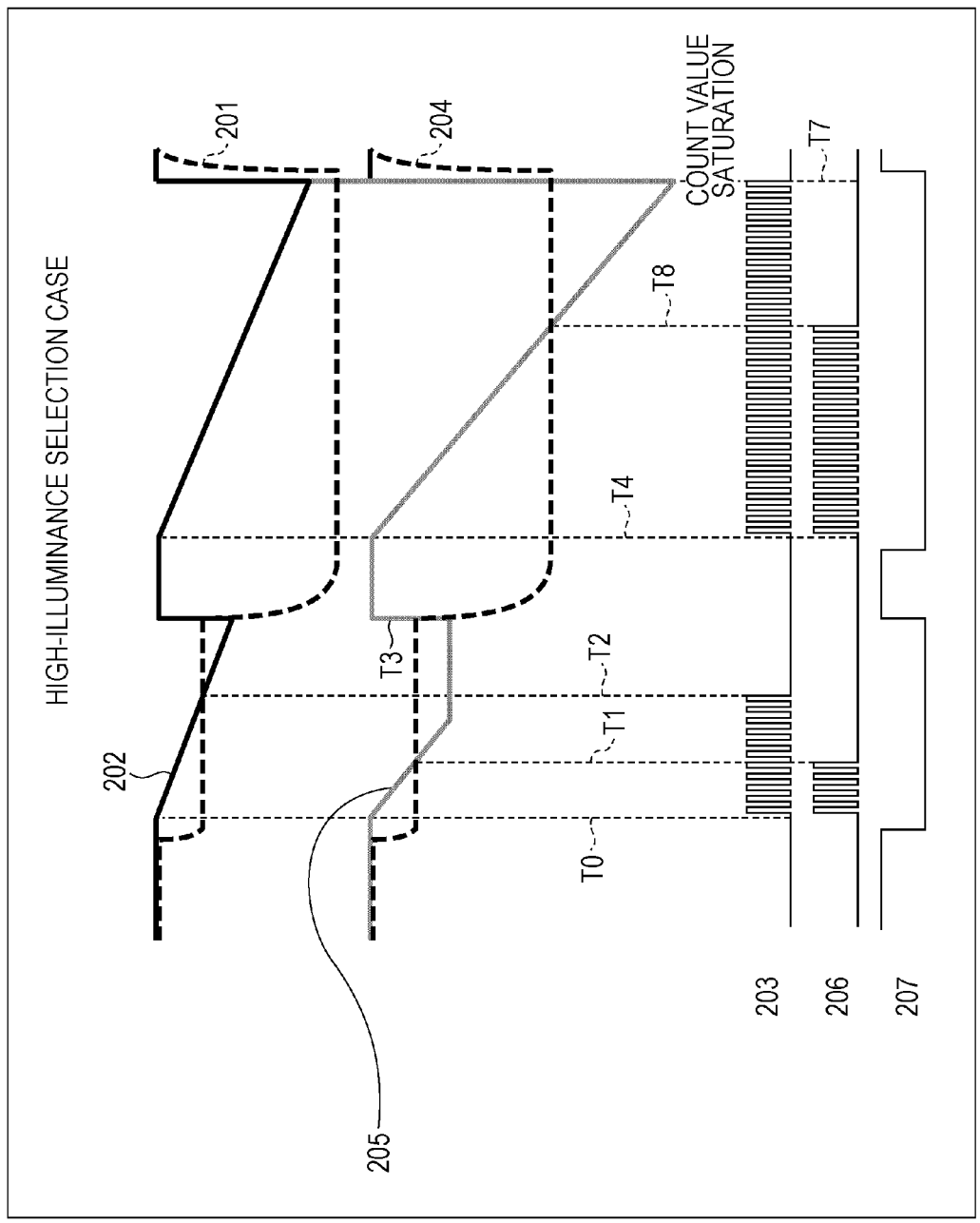
FIG. 7 is a diagram showing another example of an aspect of A/D conversion of the pixel signal.

FIG. 7 is a diagram showing an example of an aspect of A/D conversion of a pixel signal in the case in which an output of the high-illuminance side is selected. A configuration of FIG. 7 is basically the same as the configuration of FIG. 6.

In the case of the example shown in FIG. 7, at a time T8, the reference voltage 205 for the high-illuminance signal acquisition becomes smaller than the S/H circuit pixel signal 204, but the reference voltage 202 for the low-illuminance signal acquisition does not become smaller than the vertical signal line pixel signal 201 until the time T7. That is, a count value of the counter 203 for the low-illuminance signal acquisition is saturated. In this case, a count value of the U/D counter 165 is selected as an output.

From the above configuration, it is necessary to show which signal level has been selected and output. Therefore, the system control unit 106 sets flag information showing which signal level has been selected and output, according to whether the count value of the U/D counter 155 (count value of the counter 203 for the low-illuminance signal acquisition) is saturated, and outputs the flag information together with the pixel signal.

Figure 8:
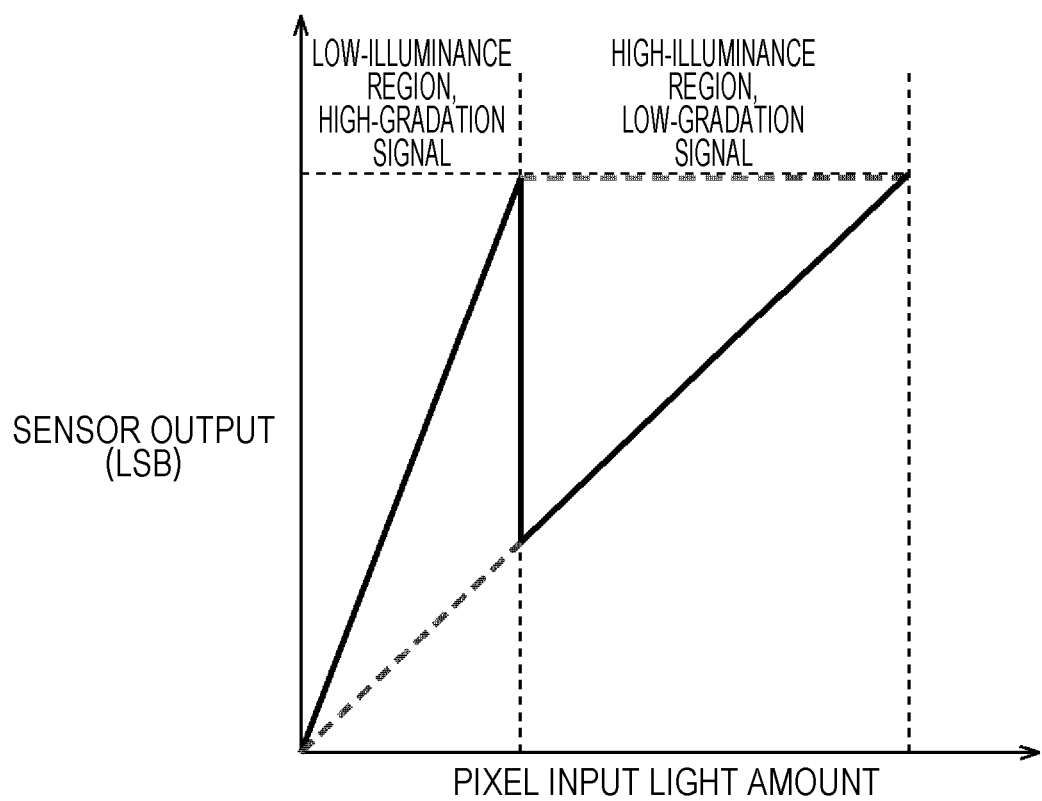
FIG. 8 is a diagram showing an example of an aspect of region division.

FIG. 8 shows an example of a relation of a pixel input light amount and a sensor output in the case in which an illuminance region is divided into two regions and signals are acquired by two A/D converters. In this example, individual maximum count values are set as the same value. However, the maximum count values may not be set as the same value.

As a division method by illuminance regions having different gradations, it is realistic to determine the division method in consideration of quantization noise, circuit kT/C noise, and optical shot noise. The optical shot noise is random noise having a property in which the noise increases when illuminance increases and becomes larger than the kT/C noise at certain illuminance. It is appropriate to divide an illuminance region such that the kT/C noise increased by addition of the S/H circuit can be ignored as compared with the optical shot noise and add the S/H circuit to reading of the high-illuminance side. In addition, it is appropriate to determine a gradation of the A/D conversion, such that the quantization noise can be ignored in each illuminance region.

As described above, the CMOS image sensor 100 can acquire a superior high-gradation image signal in which an influence of the kickback has been decreased, without sacrificing the frame rate and the number of pixels. The present technique can decrease consumption power and an area as compared with the related art and can decrease a cost.

If a count frequency is constantly set, in the case of the related art, the number of vertical signal lines per row of the pixel array is doubled whenever the number of bits increases by 1 and a parallel process is executed. For this reason, loads of each comparator, counter, and signal line are doubled.

Meanwhile, in the case of the present technique, the number of counters and comparators is doubled, regardless of the number of bits to be increased, and the number of reference voltage generators increases $(1+\alpha)$ times (when the number of reference voltage generators is two, $1+\alpha<2$). For example, when a 2-bit high gradation is realized in an illuminance region of ¼ for a full scale, because the number of circuit blocks having a current value of 0.25 times increases by 1, consumption power of the reference voltage generator is 1.25 times. Therefore, as compared with the related art from both viewpoints of consumption power and an occupation area, an effect of the present technique increases when the number of output bits required increases.

[Flow of Image Signal Output Control Process]

Next, a process that is executed by the CMOS image sensor 100 described above will be described. First, an example of a flow of an image signal output control process will be described with reference to a flowchart of FIG. 9. The image signal output control process is the control process to output the image signal, as described above with reference to FIG. 6 or 7.

If the image signal output control process starts, in step S101, the system control unit 106 controls the row scanning unit 103 and the column scanning unit 105 and selects a non-processed pixel as a processing target (attention pixel).

In step S102, according to the control of the system control unit 106, the column processing unit 104 executes a signal read process, reads the reset voltage of the FD of the attention pixel as a black level of the pixel, and executes the A/D conversion.

In step S103, according to the control of the system control unit 106, the column processing unit 104 executes the signal read process, reads the vertical signal line output as a pixel signal level, and executes the A/D conversion.

In step S104, the column processing unit 104 subtracts the black level read in step S102 from the pixel signal level read in step S103 and executes the digital CDS.

As described above, if the pixel value of the attention pixel is read, in step S105, the system control unit 106 determines whether the pixel signals of all of the pixels 120 of the pixel array unit 102 have been processed. When there is the non-processed pixel, the system control unit 106 returns the process to step S101 and repeats the following process.

In addition, as described above, the processes of steps S101 to S105 are repeated and when it is determined in step S105 that all of the pixels have been processed, the system control unit 106 ends the image signal output control process.

[Flow of Signal Read Process]

Next, an example of a flow of the signal read process that is executed in steps S102 and S103 of FIG. 9 will be described with reference to a flowchart of FIG. 10.

Figure 9:
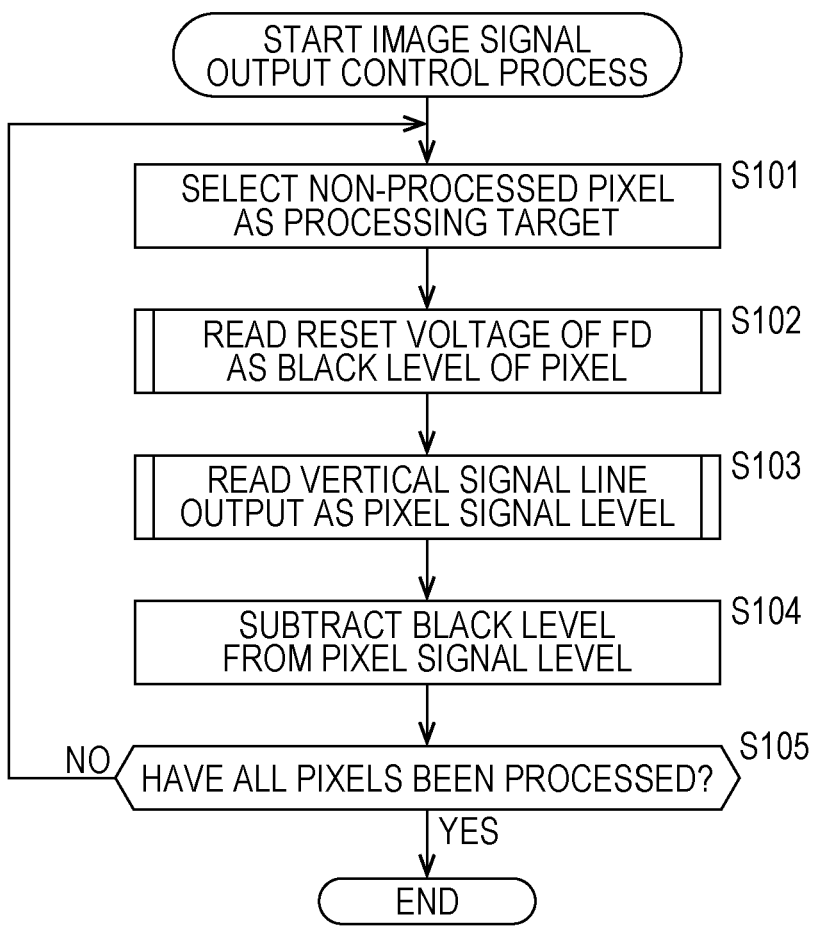
FIG. 9 is a flowchart showing an example of a flow of an image signal output control process.
Figure 10:
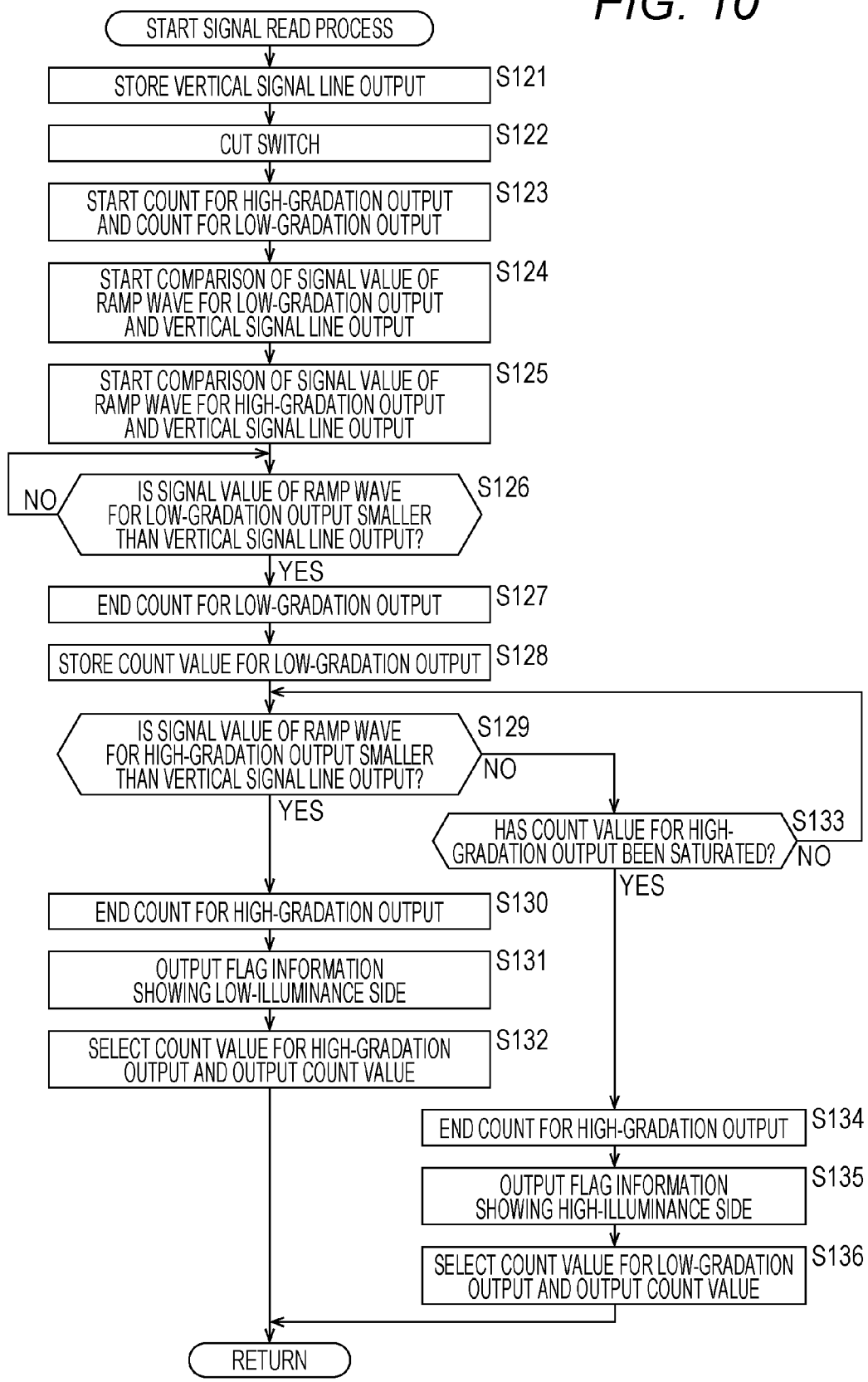
FIG. 10 is a flowchart showing an example of a flow of a signal read process.

In steps S102 and S103 of FIG. 9, the same signal read process in which only the processed signals are different is executed. In the following description, only the signal read process for the pixel signal executed in step S103 will be described for convenience of the description.

When the signal read process starts, the switch 171 is turned on (connection state).

If the signal read process starts, in step S121, the capacitor 172 stores the vertical signal line output (pixel signal level of the attention pixel). In a period until the A/D conversion of the pixel signal starts after step S121 ends, in step S122, the switch 171 becomes a cutting state (turned off) and electrically cuts the vertical signal line 108 and the capacitor 161.

In step S123, the U/D counter 155 and the U/D counter 165 start the count for the high-gradation output and the count for the low-gradation output. In step S124, the comparator 163 starts a comparison of the signal value of the ramp wave for the low-gradation output and the vertical signal line output (pixel signal level of the attention pixel).

In step S125, the comparator 153 starts a comparison of the signal value of the ramp wave for the high-gradation output and the vertical signal line output (pixel signal level of the attention pixel).

In step S126, the comparator 163 determines whether the signal value of the ramp wave for the low-gradation output is smaller than the vertical signal line output and repeats the determination until it is determined that the signal value of the ramp wave for the low-gradation output is smaller than the vertical signal line output. When it is determined in step S126 that the signal value of the ramp wave for the low-gradation output is smaller than the vertical signal line output, the comparator 163 makes the process proceed to step S127.

In step S127, the U/D counter 165 ends the count for the low-gradation output. In addition, in step S128, the U/D counter 165 stores the count value for the low-gradation output which is the count value when the count has ended.

In step S129, the comparator 153 determines whether the signal value of the ramp wave for the high-gradation output is smaller than the vertical signal line output. In actuality, this process is executed in parallel to the process of the low-gradation side of step S126, for example. However, in this case, because the low-gradation side is inverted earlier by all means, the process is described as the process of step S129 after the low-gradation side is inverted. When it is determined that the signal value of the ramp wave for the high-gradation output is smaller than the vertical signal line output, the comparator 153 makes the process proceed to step S130.

In step S130, the U/D counter 155 ends the count for the high-gradation output. In step S131, the U/D counter 155 outputs flag information showing the low-illuminance side. In step S132, the U/D counter 155 selects the count value for the high-gradation output and outputs the count value. If the process of step S132 ends, the U/D counter 155 ends the signal read process and returns the process to FIG. 9.

In addition, when it is determined in step S129 that the signal value of the ramp wave for the high-gradation output is not smaller than the vertical signal line output, the comparator 153 makes the process proceed to step S133.

In step S133, the comparator 153 determines whether the count value for the high-gradation output has been saturated. When it is determined that the count value for the high-gradation output has not been saturated, the comparator 153 returns the process to step S129 and repeats subsequent processes.

In addition, when it is determined that the A/D conversion for the vertical signal line output has ended (the time has reached T7) and it is determined in step S133 that the count value for the high-gradation output has been saturated, the comparator 153 makes the process proceed to step S134.

In step S134, the U/D counter 155 ends the count for the high-gradation output. In step S135, the U/D counter 155 outputs flag information showing the high-illuminance side. In step S136, the U/D counter 165 selects the count value for the low-gradation output stored in step S128 and outputs the count value. If the process of step S136 ends, the U/D counter 165 ends the signal read process and returns the process to FIG. 9.

As described above, each process is executed, so that the CMOS image sensor 100 can output a high-gradation image having a higher image quality without sacrificing the frame rate.

[A/D Conversion Start Time Control 1]

The case in which the A/D conversion process of the highest gradation and the A/D conversion processes of the other gradations start at the same time has been described. However, the present disclosure is not limited thereto and the A/D conversion processes may start at different times.

By setting start times of a plurality of ramp waves differently and performing driving, a kickback reduction effect can be increased.

Figure 11:
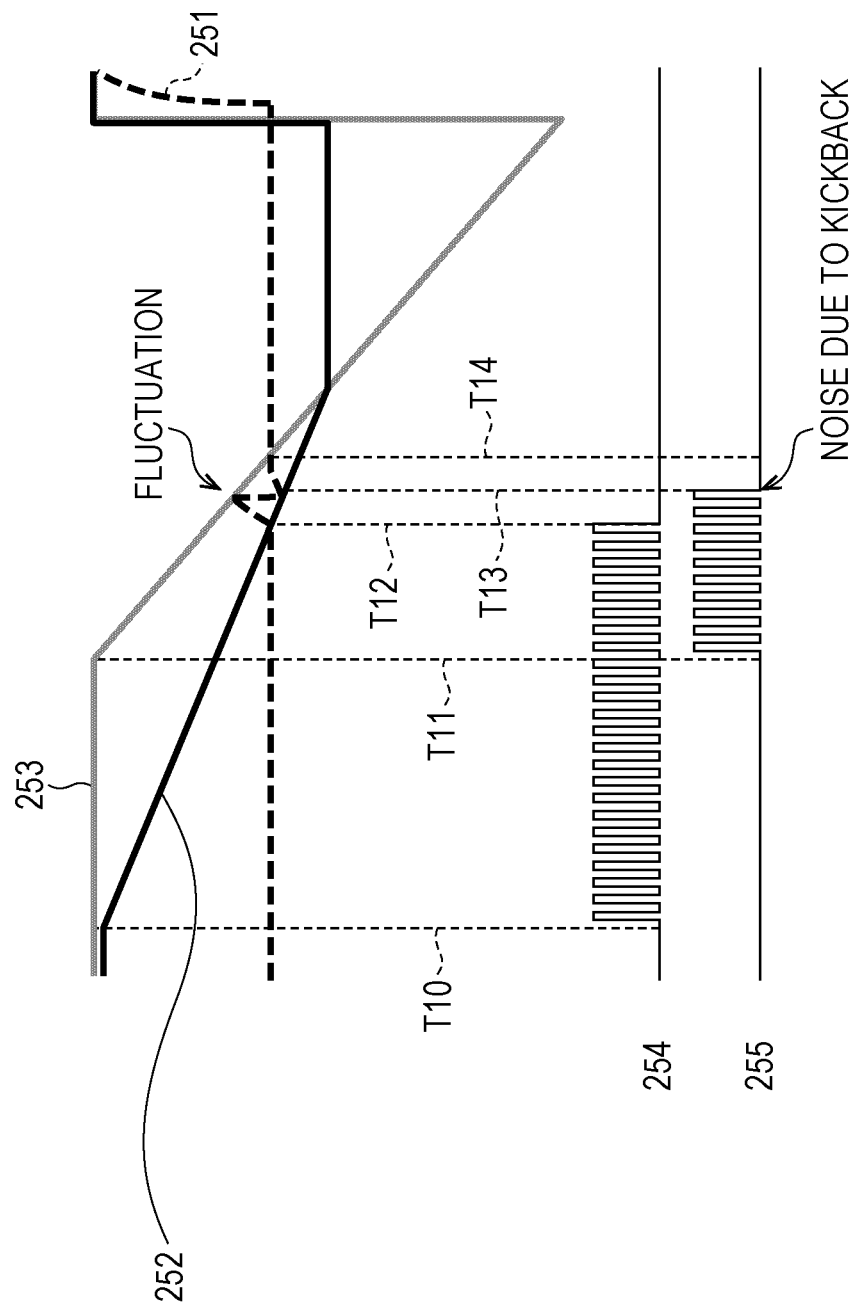
FIG. 11 is a diagram showing still another example of an aspect of A/D conversion of a pixel signal.

For example, as shown in FIG. 11, the ramp wave having the most moderate inclination may start earlier and the comparator 153 for the high-gradation signal acquisition may be inverted earlier. To do so, after the ramp wave having the most moderate inclination may start earlier (time T10), the ramp wave having the rapid inclination may start at timing (time T11) when the voltage values of the ramp wave having the most moderate inclination and the ramp wave having the rapid inclination do not cross each other. In addition, the count by the U/D counter 155 or the U/D counter 165 may be started/ended according to the timing.

In this case, as shown in FIG. 11, whenever the signal is at the low-illuminance side, the comparator 153 for the high-gradation signal acquisition inverts an output earlier by all means (time T12). That is, the reference voltage 252 for the low-illuminance signal acquisition becomes smaller than the vertical signal line (S/H circuit) pixel signal 251, earlier than the reference voltage 253 for the high-illuminance signal acquisition.

The kickback generated by the inversion of the comparator 153 may fluctuate an input terminal of the comparator 163 for the low-gradation acquisition through the sample-and-hold unit 170 and large noise may be included. However, in this case, because the low-gradation signal is not selected, noise does not cause a problem, even though the noise is included in the count value of the U/D counter 165.

In contrast, when the low-gradation signal is selected, that is, the pixel value of the attention pixel exists in the high-illuminance region, the kickback is not generated because the high-gradation signal is saturated (an output of the comparator 153 is not inverted).

Therefore, in this case, the column ADC 140 can further suppress the fluctuation of the signal level due to kickback from being propagated. That is, the CMOS image sensor 100 can output an image of a higher image quality.

When the comparator 155 for the high-gradation signal acquisition inverts the output, the count operation for the low-gradation signal acquisition by the U/D counter 165 may be stopped. In this way, the column ADC 140 can decrease execution of the unnecessary process and decrease the consumption power.

[Flow of Signal Read Process]

Even in this case, the image signal output control process is executed in the same way as the case described above with reference to the flow chart of FIG. 9. However, the signal read process is executed as shown in a flowchart of FIG. 12. An example of a flow of the signal read process will be described with reference to the flowchart of FIG. 12. Because the process of step S102 and the process of step S103 are executed in the same way, similar to the case of FIG. 10, only the A/D conversion of the pixel signal level of step S103 will be described hereinafter.

Each process of steps S201 and S202 is executed in the same way as each process of steps S121 and S122.

In step S203, the U/D counter 155 starts the count for the high-gradation output. In step S204, the comparator 153 starts a comparison of the signal value of the ramp wave for the high-gradation output and the vertical signal line output (pixel signal level of the attention pixel).

In step S205, the U/D counter 165 maintains a waiting state for a predetermined time. Then, in step S206, the U/D counter 165 starts the count for the low-gradation output. In step S207, the comparator 163 starts a comparison of the signal value of the ramp wave for the low-gradation output and the vertical signal line output (pixel signal level of the attention pixel).

Each process of steps S208 to S214 is executed in the same way as each process of steps S129 to S135.

In step S215, the comparator 163 determines whether the signal value of the ramp wave for the low-gradation output is smaller than the vertical signal line output (output of the sample-and-hold unit 170), similar to the case of step S126. In actuality, this process is executed in parallel to the process of the high-gradation side of step S208. However, in this case, because the high-gradation side is inverted (or saturated) earlier by all means, the process is described as the process of step S215 after the high-gradation side is saturated.

The comparator 163 repeats the determination until it is determined in step S215 that the signal value of the ramp wave for the low-gradation output is smaller than the vertical signal line output. When it is determined that the signal value of the ramp wave for the low-gradation output is smaller than the vertical signal line output, the comparator 163 makes the process proceed to step S216.

In step S216, the U/D counter 165 ends the count for the low-gradation output. In addition, in step S217, the U/D counter 165 selects the count value for the low-gradation output which is the count value when the count has ended and outputs the count value.

If the process of step S217 ends, the U/D counter 165 ends the signal read process and returns the process to FIG. 9.

In this way, the CMOS image sensor 100 can output an image of a higher image quality.

[A/D Conversion Start Time Control 2]

Figure 13:
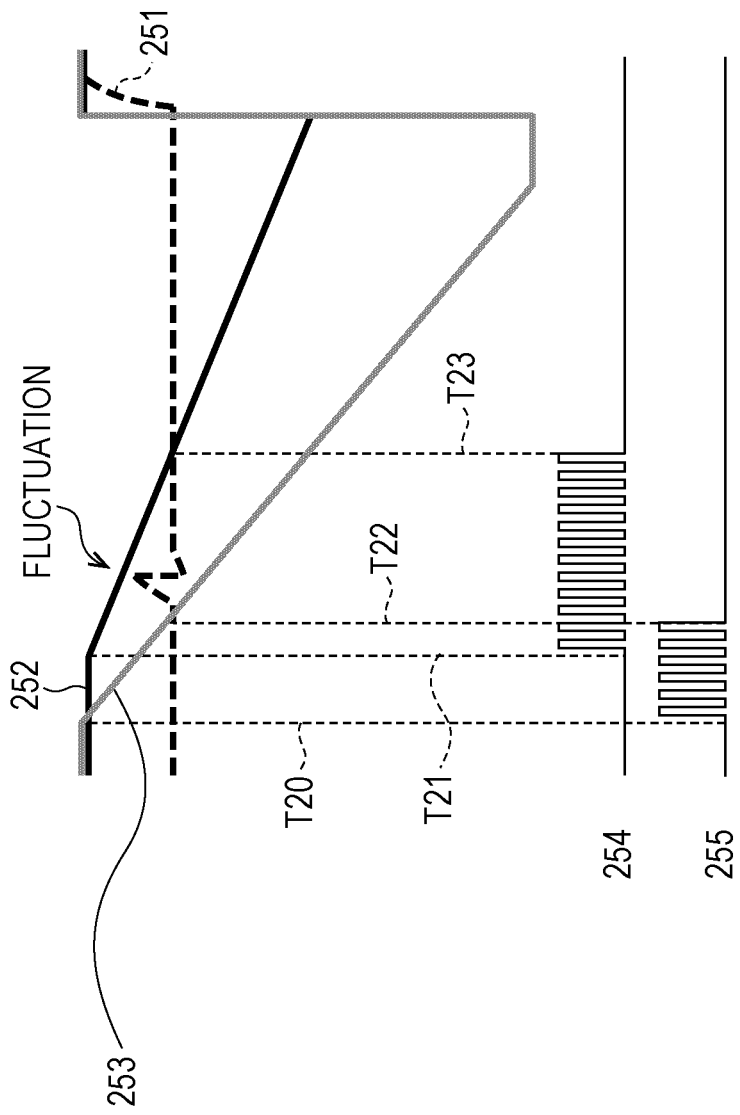
FIG. 13 is a diagram showing still another example of an aspect of A/D conversion of the pixel signal.

In contrast, for example, as shown in FIG. 13, the ramp wave having the rapid inclination may start earlier and the ramp wave having the most moderate inclination may start after a predetermined time passes.

That is, first, the ramp wave having the rapid inclination may start earlier (time T20) and the ramp wave having the most moderate inclination may start after the predetermined time passes (time T21). In addition, the count by the U/D counter 155 or the U/D counter 165 may be started/ended according to the timing.

In this case, as shown in FIG. 13, the voltage values of the individual ramp waves are different as much as the predetermined waiting time, as compared with the case described above with reference to FIGS. 6 and 7. Therefore, as shown in FIG. 13, even though the fluctuation is generated in the signal level of the vertical signal line output, due to the kickback of the low-gradation side (time T22), the possibility of the fluctuation causing the inversion of the high-gradation side becomes low. As such, if the inversion caused by the kickback is not generated, an accurate count value (time T23) can also be obtained at the high-gradation side.

That is, even in this case, the column ADC 140 can further suppress the fluctuation of the signal level due to the kickback from being propagated. That is, the CMOS image sensor 100 can output an image of a higher image quality.

[Flow of Signal Read Process]

Even in this case, the image signal output control process is executed in the same way as the case described above with reference to the flow chart of FIG. 9. However, the signal read process is executed as shown in a flowchart of FIG. 14. An example of a flow of the signal read process will be described with reference to the flowchart of FIG. 14. Because the process of step S102 and the process of step S103 are executed in the same way, similar to the case of FIG. 10, only the A/D conversion of the pixel signal level of step S103 will be described hereinafter.

Each process of steps S231 and S232 is executed in the same way as each process of steps S121 and S122.

In step S233, the U/D counter 165 starts the count for the low-gradation output. In step S234, the comparator 163 starts a comparison of the signal value of the ramp wave for the low-gradation output and the vertical signal line output (pixel signal level of the attention pixel).

In step S235, the U/D counter 155 maintains a waiting state for a predetermined time. Then, in step S236, the U/D counter 155 starts the count for the high-gradation output. In step S237, the comparator 153 starts a comparison of the signal value of the ramp wave for the high-gradation output and the vertical signal line output (pixel signal level of the attention pixel).

Each process of steps S238 to S248 is executed in the same way as each process of steps S129 to S136.

In this way, the CMOS image sensor 100 can output an image of a higher image quality.

[A/D Conversion Start Time Control 3]

As described above, an influence of the kickback can be suppressed from being propagated, even when the A/D conversion process of the highest gradation and the A/D conversion processes of the other gradations start at different times. Therefore, in this case, the sample-and-hold unit 170 may be omitted and an input/output thereof may be short-circuited at all times (the capacitor 161 which is included in the configuration of the A/D converting unit of the low-gradation side is connected to the vertical signal line 108 at all times). In this way, the configuration of the column ADC 140 can be further simplified.

This can be applied to both the case in which the ramp wave having the most moderate inclination starts earlier and the ramp wave having the rapid inclination starts after the predetermined time passes (FIG. 11) and the case in which the ramp wave having the rapid inclination starts earlier and the ramp wave having the most moderate inclination starts after the predetermined time passes (FIG. 13).

Figure 12:
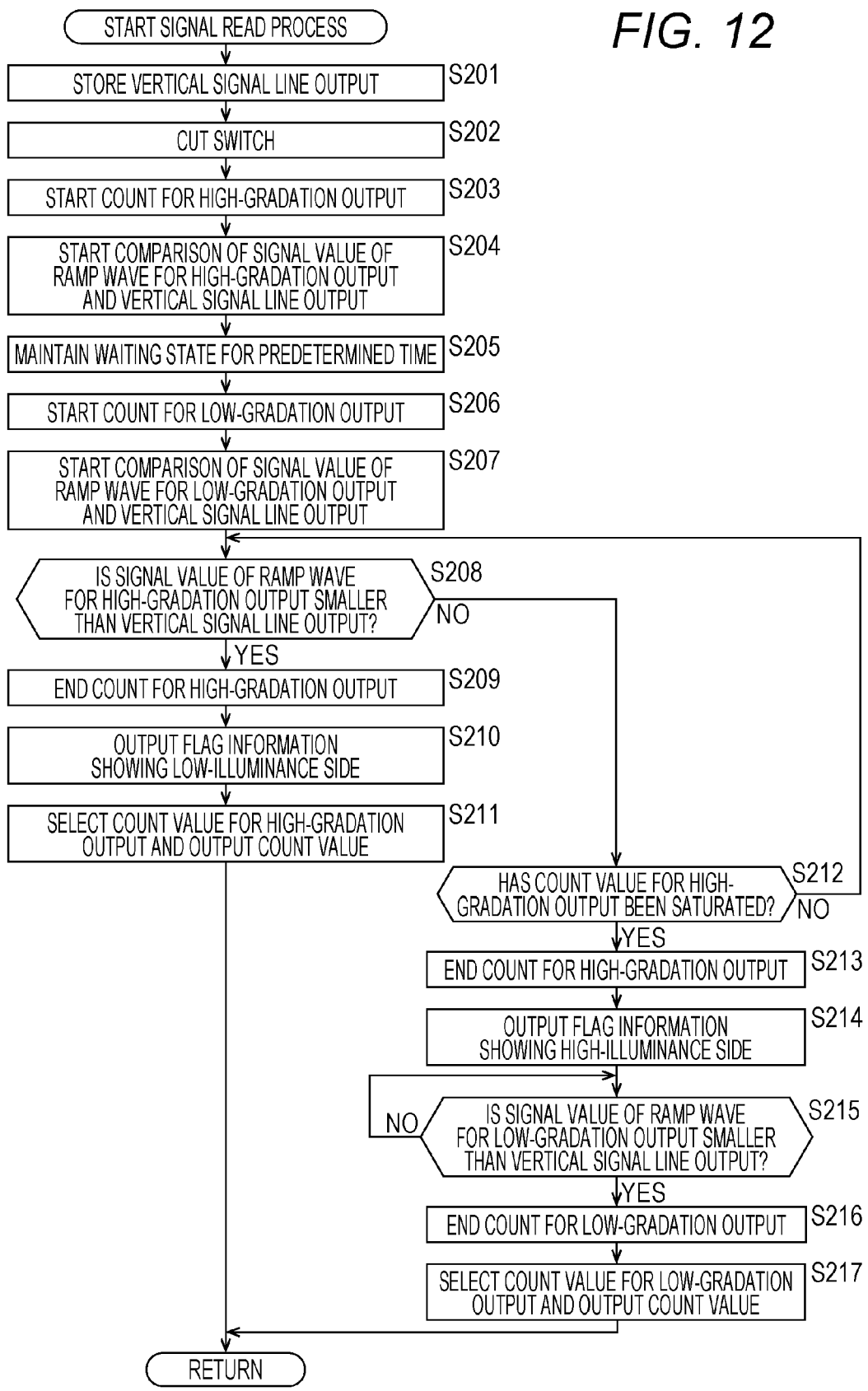
FIG. 12 is a flowchart showing another example of a flow of the signal read process.
Figure 14:
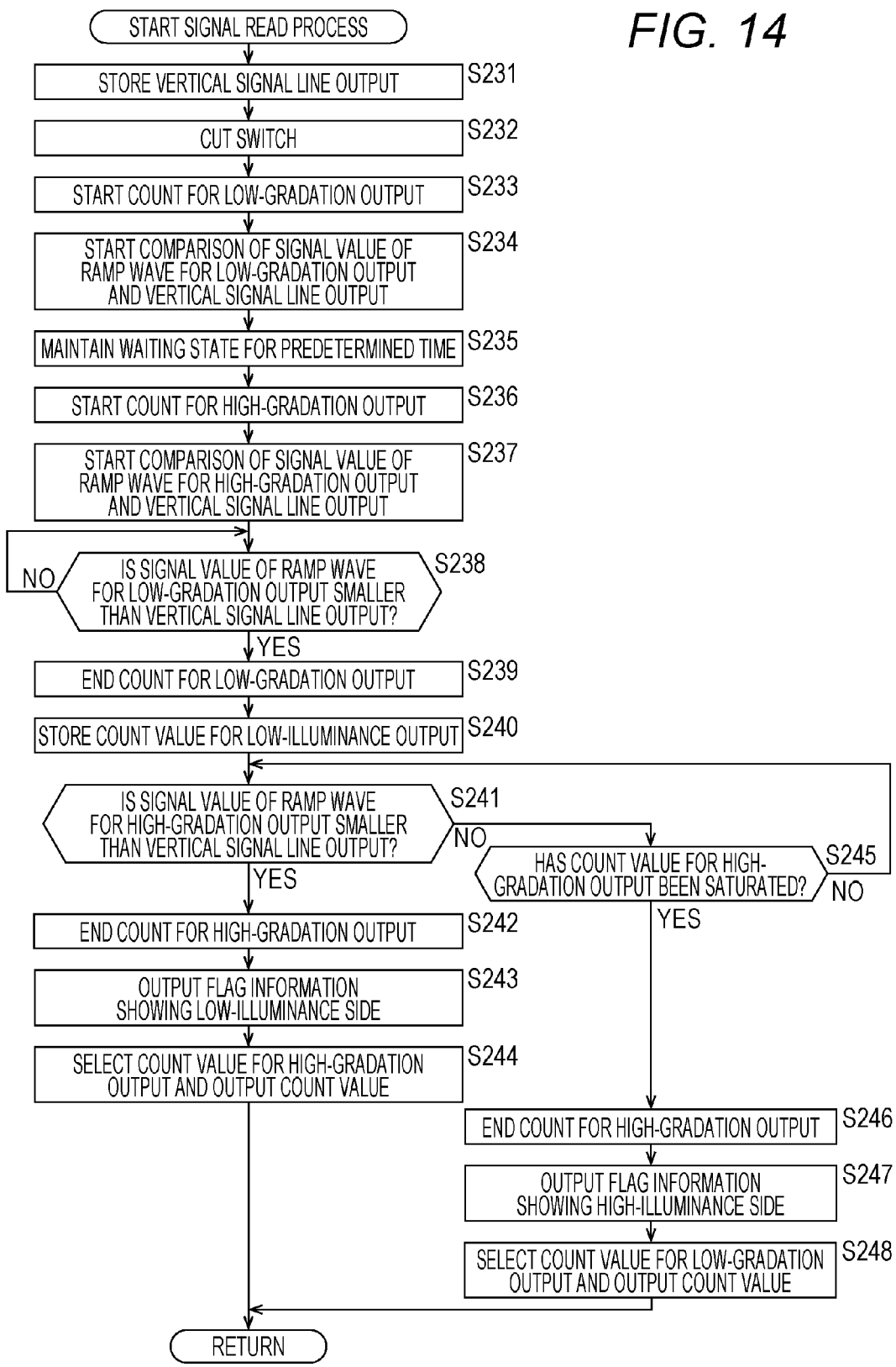
FIG. 14 is a flowchart showing still another example of a flow of the signal read process.

In the signal read process, each process of steps S201 and S202 may be omitted in the case of FIG. 12 and each process of steps S231 and S232 may be omitted in the case of FIG. 14. That is, in this case, the signal read process can also be facilitated.

[Three Region Division]

In the above case, the range of the values that can be taken by the signal level (pixel value) of the vertical signal line output has been divided into the two regions of the low-illuminance region and the high-illuminance region. However, the number of regions after the division is arbitrary and the range may be divided into three regions or more.

In the case in which the range is divided into the three regions or more and read is performed, during signal reading of a region of a longest read period, signals of other illuminance regions may be read.

Hereinafter, more specific description is given on the basis of an example of the case in which the range is divided into three regions of a high-illuminance region, an intermediate-illuminance region, and a low-illuminance region. This should basically be the same in the case in which the range is divided into four regions or more.

Figure 15:
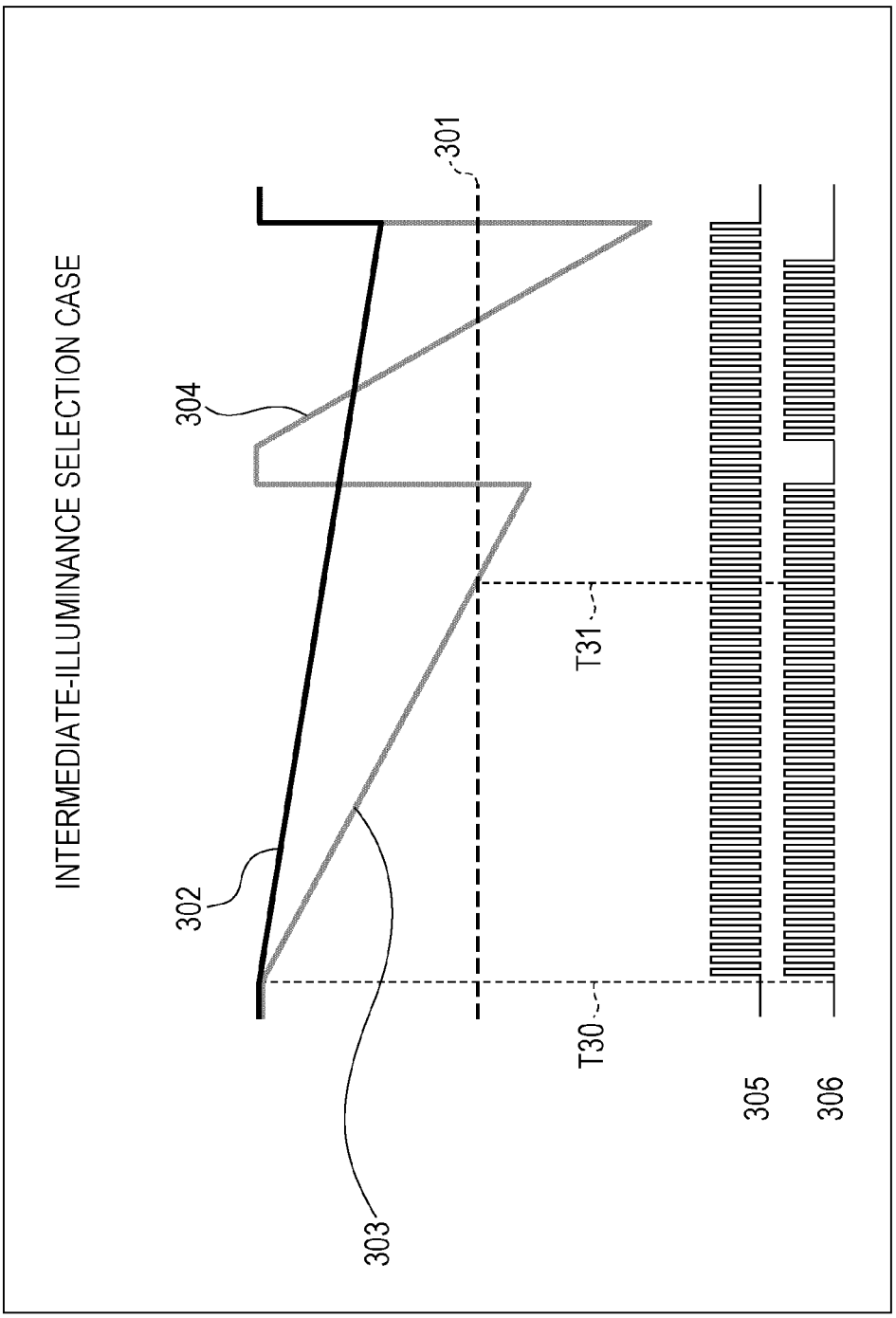
FIG. 15 is a diagram showing an example of an aspect of A/D conversion of the pixel signal in the case of three regions.

FIG. 15 is a diagram showing an example of an aspect of the A/D conversion in the case in which a pixel value is positioned at the intermediate-illuminance region.

As shown in FIG. 15, in this case, read of the intermediate-illuminance region (A/D conversion of an intermediate gradation) is executed in parallel to signal read of the low-illuminance region (A/D conversion of a high gradation) in which a read time is longest and read of the high-illuminance region (A/D conversion of a low gradation) is executed.

That is, first, the reference signal generation circuit 132 starts generation of a ramp wave for the intermediate gradation having the second moderate inclination at the same time as when the reference signal generation circuit 131 starts generation of a ramp wave for the high gradation having the most moderate inclination. In addition, the reference signal generation circuit 132 sequentially generates the ramp wave for the intermediate gradation and the ramp wave for the low gradation having the most rapid inclination while the reference signal generation circuit 131 generates the ramp wave for the high gradation.

When the pixel value is in the intermediate-illuminance region like the example of FIG. 15, the comparator 163 inverts an output at a time T31 when a reference voltage 303 for the intermediate-illuminance signal acquisition becomes smaller than a vertical signal line (S/H circuit) pixel signal 301. In this case, a value of a counter 305 for the low-illuminance signal acquisition is saturated (a reference voltage 302 for the low-illuminance signal acquisition does not become smaller than the vertical signal line (S/H circuit) pixel signal 301).

As such, when the count value of the counter is saturated in the A/D conversion of the high gradation and is not saturated in the A/D conversion of the intermediate gradation, a count value of a counter 306 for the intermediate/high-illuminance signal acquisition is selected as an A/D conversion result of the intermediate gradation and is output.

Figure 16:
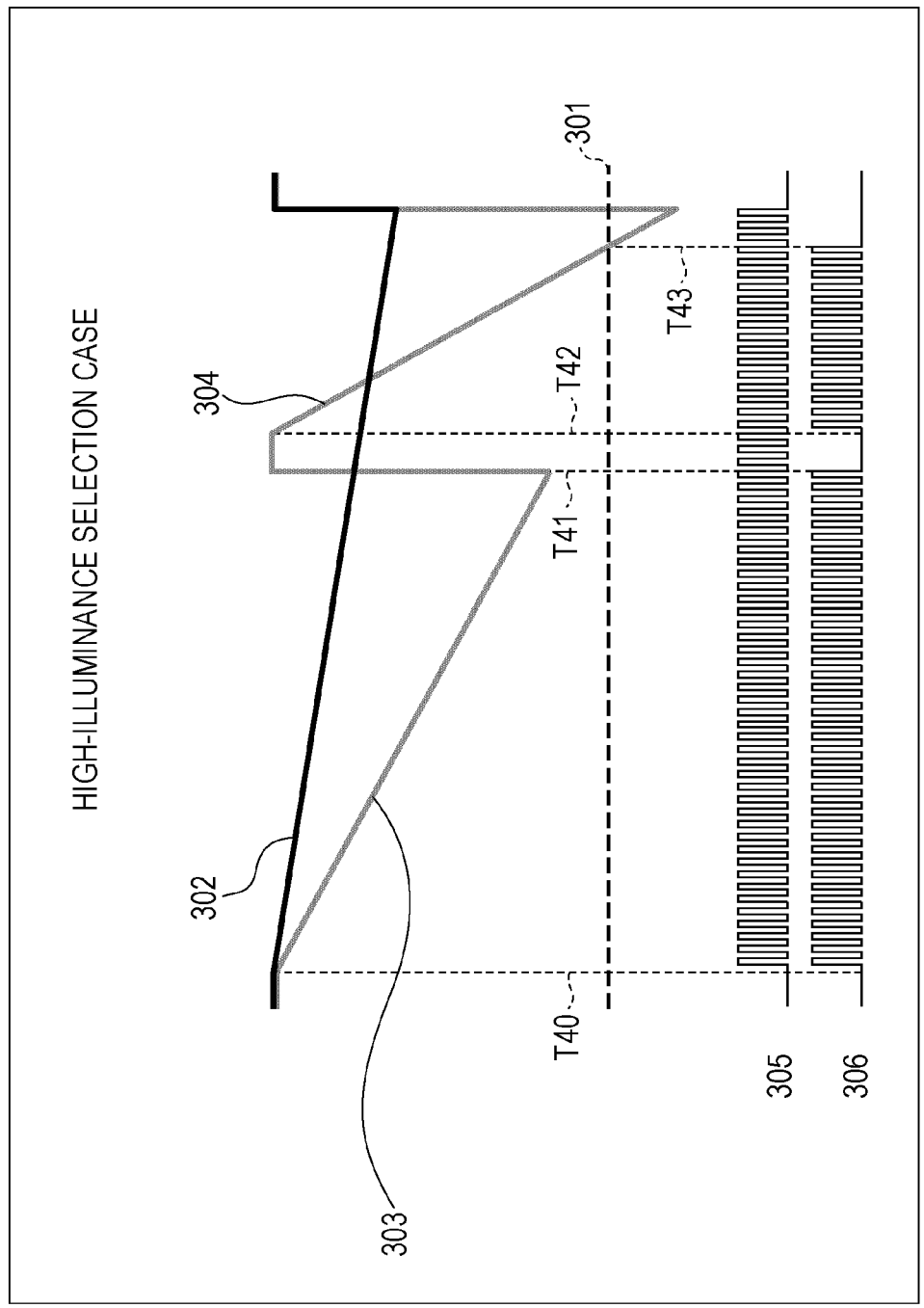
FIG. 16 is a diagram showing another example of an aspect of A/D conversion of the pixel signal in the case of the three regions.

FIG. 16 is a diagram showing an example of an aspect of the A/D conversion in the case in which the pixel value is positioned at the high-illuminance region.

When the pixel value is in the high-illuminance region like the example of FIG. 16, the reference voltage 303 for the intermediate-illuminance signal acquisition does not become smaller than the vertical signal line (S/H circuit) pixel signal 301 and at a time T41, the A/D conversion of the intermediate gradation is saturated. Then, at a time T42, generation of the ramp wave for the low gradation having the most rapid inclination starts. The comparator 163 inverts an output at a time T43 when a reference voltage 304 for the high-illuminance signal acquisition becomes smaller than the vertical signal line (S/H circuit) pixel signal 301. Even in this case, a value of a counter 305 for the low-illuminance signal acquisition is saturated (the reference voltage 302 for the low-illuminance signal acquisition does not become smaller than the pixel signal 301).

As such, when the count value of the counter is saturated in the A/D conversions of the high gradation and the intermediate gradation and the value is not saturated in the A/D conversion of the low gradation, a count value of a counter 306 for the intermediate/high-illuminance signal acquisition is selected as the A/D conversion result of the low gradation and is output.

Although illustration is omitted, when the count value of the counter is not saturated in the A/D conversion of the high gradation, the count value of the counter 305 for the low-illuminance signal acquisition is selected as the A/D conversion result of the high gradation and is output.

Flag information showing A/D conversion result of which gradation the selected and output count value is from is also output together with the count value thereof. A value of the flag information can be easily set on the basis of whether the A/D conversion of each gradation is saturated, that is, the outputs of the comparators 153 and 163 are inverted.

That is, for example, when the output of the comparator 153 is inverted, the flag information is set to a value showing that the selected count value is the A/D conversion result of the high gradation. In addition, for example, when the output of the comparator 153 is not inverted and the output of the comparator 163 is inverted during a period from a time T40 to a time T41, the flag information is set to a value showing that the selected count value is the A/D conversion result of the intermediate gradation. In addition, for example, when the output of the comparator 153 is not inverted and the output of the comparator 163 is inverted during a period from a time T42 to a time T43, the flag information is set to a value showing that the selected count value is the A/D conversion result of the low gradation.

In the case of the example shown in FIG. 15, the A/D conversion of the low gradation becomes unnecessary. Therefore, after the time T31, the U/D counter 165 may be stopped. As such, even though the ramp wave of the high-illuminance region (low-gradation signal) starts thereafter, if the counter is not operated, consumption power can be decreased.

Figure 17:
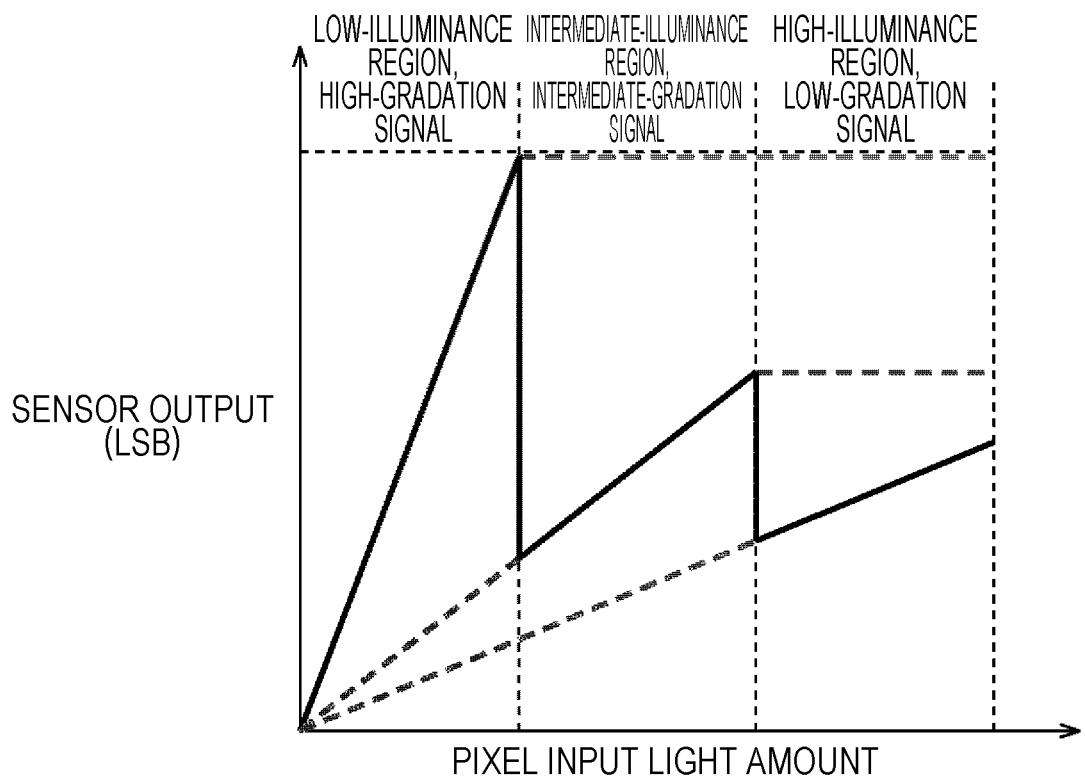
FIG. 17 is a diagram showing an example of an aspect of the three region division.

FIG. 17 shows an example of a relation of a pixel input light amount and a sensor output that can be acquired in this example. In this case, a maximum count value acquired in the low-illuminance region becomes larger than a value obtained by adding maximum count values of the intermediate-illuminance region and the high-illuminance region.

As described above, the number of A/D converters per vertical signal line and the number of divisions of illuminance regions having different gradations may not be the same. By an operation according to this embodiment, the column ADC 140 can decrease consumption power and an area.

[Flow of Signal Read Process]

Even in this case, the image signal output control process is executed in the same way as the case described above with reference to the flow chart of FIG. 9. However, the signal read process is executed as shown in a flowchart of FIG. 18. An example of a flow of the signal read process will be described with reference to the flowchart of FIG. 18. Because the process of step S102 and the process of step S103 are executed in the same way, similar to the case of FIG. 10, only the A/D conversion of the pixel signal level of step S103 will be described hereinafter.

Each process of steps S301 and S302 is executed in the same way as each process of steps S121 and S122.

In step S303, the A/D converting unit of the high-gradation side of the column ADC 140 executes the high-gradation signal read process and executes the A/D conversion of the high gradation. In parallel to this process, in step S304, the A/D converting unit of the intermediate/low-gradation side (not the high-gradation side) of the column ADC 140 executes the intermediate/low-gradation signal read process and executes the A/D conversions of the intermediate gradation and the low gradation.

If the processes of steps S303 and S304 end, in step S305, the U/D counter 155 and the U/D counter 165 select the count value on the basis of the value of the flag information set by the processes of steps S303 and S304 and output the count value together with the flag information.

If the process of step S305 ends, the U/D counter 155 and the U/D counter 165 end the signal read process and return the process to FIG. 9.

[Flow of High-Gradation Signal Read Process]

Figure 18:
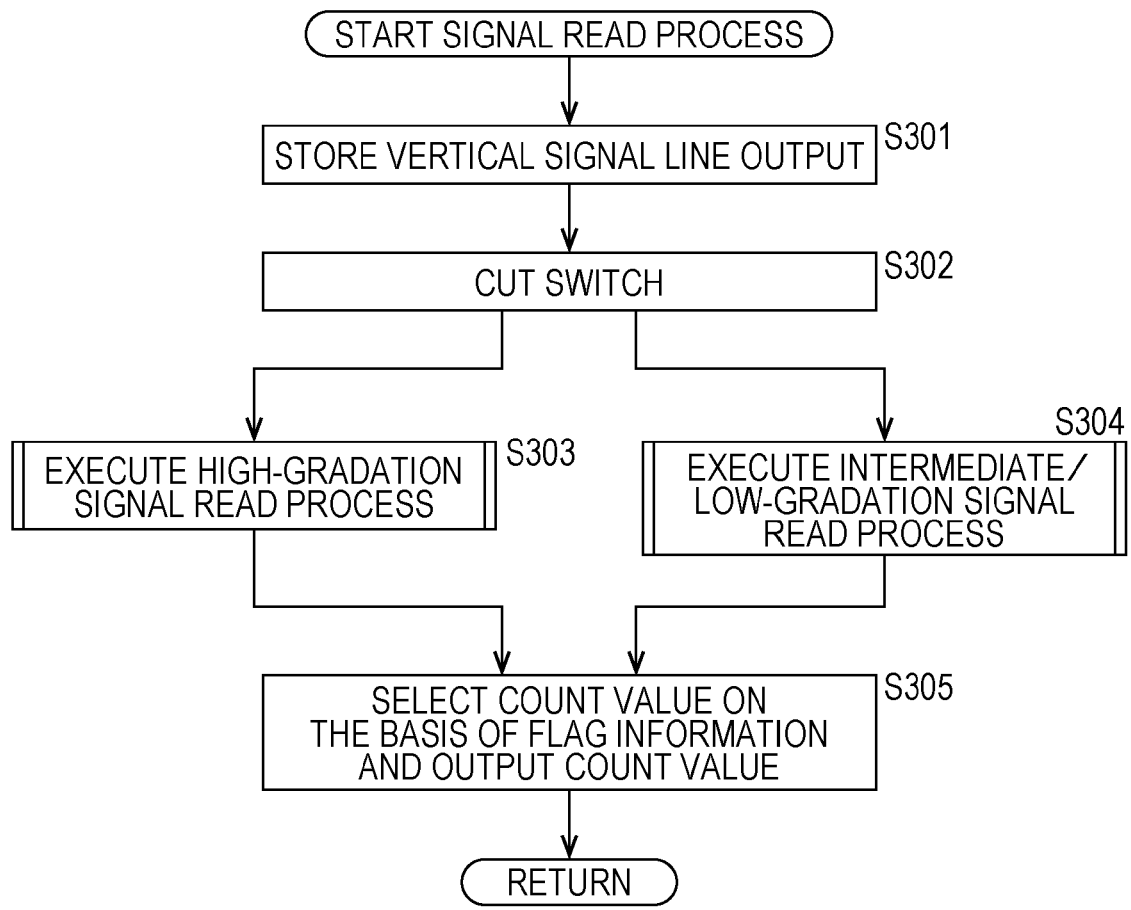
FIG. 18 is a flowchart showing an example of a flow of the signal read process.
Figure 19:
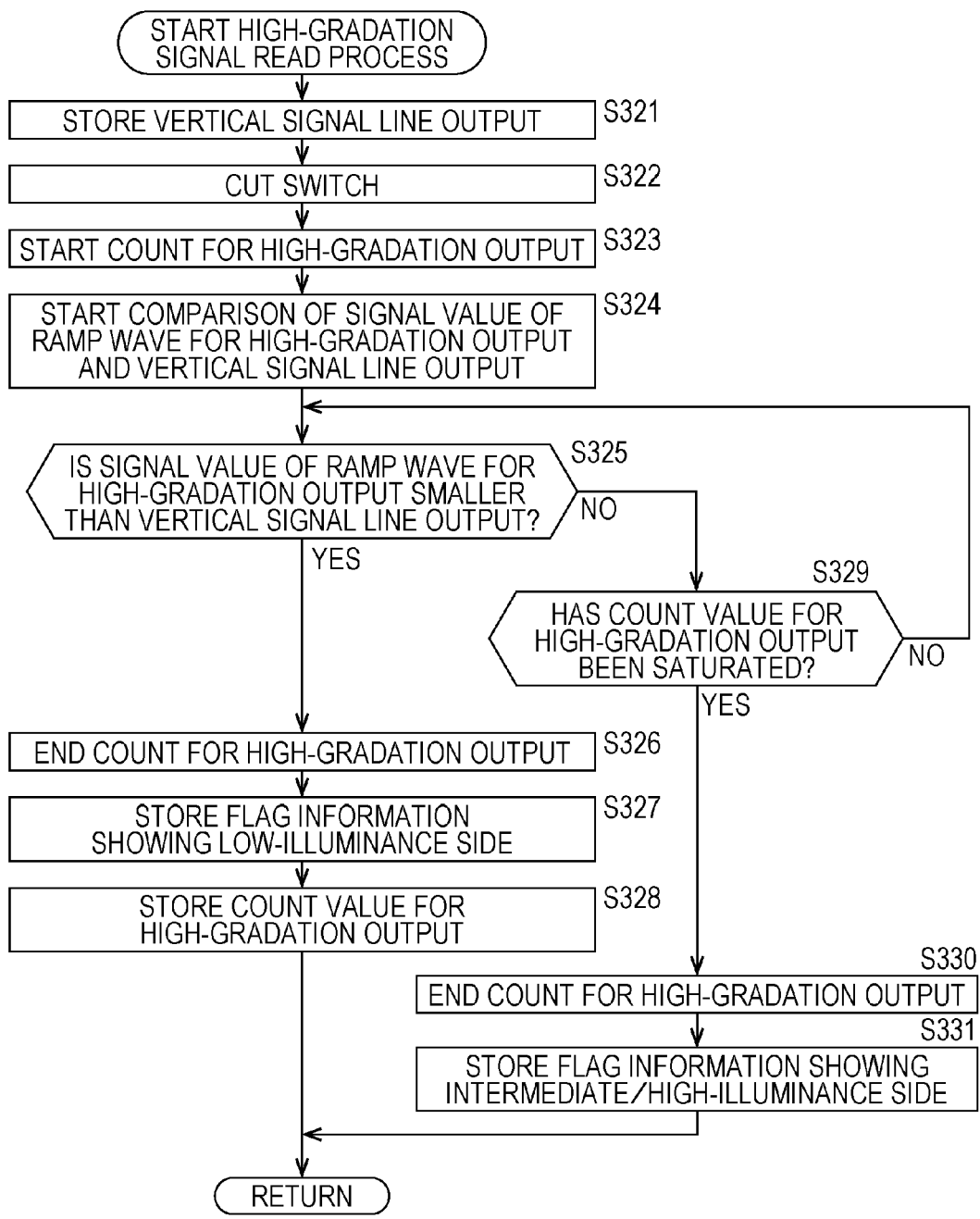
FIG. 19 is a flowchart showing an example of a flow of a high-gradation signal read process.

Next, an example of a flow of the high-gradation signal read process executed in step S303 of FIG. 18 will be described with reference to the flowchart of FIG. 19.

When the high-gradation signal read process starts, in step S321, the capacitor 172 stores the vertical signal line output (pixel signal level of the attention pixel). During a period until the A/D conversion of the pixel signal starts after step S321 ends, in step S322, the switch 171 becomes a cutting state (turned off) and electrically cuts the vertical signal line 108 and the capacitor 161.

In step S323, the U/D counter 155 starts the count for the high-gradation output. In step S324, the comparator 153 starts a comparison of the signal value of the ramp wave for the high-gradation output and the vertical signal line output (pixel signal level of the attention pixel).

In step S325, the comparator 153 determines whether the signal value of the ramp wave for the high-gradation output is smaller than the vertical sign al line output. When it is determined that the signal value of the ramp wave for the high-gradation output is smaller than the vertical signal line output, the comparator 153 makes the process proceed to step S326.

In step S326, the U/D counter 155 ends the count for the high-gradation output. In step S327, the U/D counter 155 sets the flag information showing the low-illuminance side and stores the flag information. In step S328, the U/D counter 155 stores the count value for the high-gradation output when the count has ended in step S326. If the process of step S328 ends, the U/D counter 155 ends the high-gradation signal read process and returns the process to FIG. 18.

In addition, when it is determined in step S325 that the signal value of the ramp wave for the high-gradation output is not smaller than the vertical signal line output, the comparator 153 makes the process proceed to step S329.

In step S329, the comparator 153 determines whether the count value for the high-gradation output has been saturated. When it is determined that the count value for the high-gradation output has not been saturated, the comparator 153 returns the process to step S325 and repeats subsequent processes.

In addition, when it is determined in step S329 that the count value for the high-gradation output has been saturated, the comparator 153 makes the process proceed to step S330.

In step S330, the U/D counter 155 ends the count for the high-gradation output. In step S331, the U/D counter 155 sets the flag information showing the intermediate-illuminance side and stores the flag information. If the process of step S331 ends, the U/D counter 155 ends the high-gradation signal read process and returns the process to FIG. 18.

[Flow of Intermediate/Low-Gradation Signal Read Process]

Figure 20:
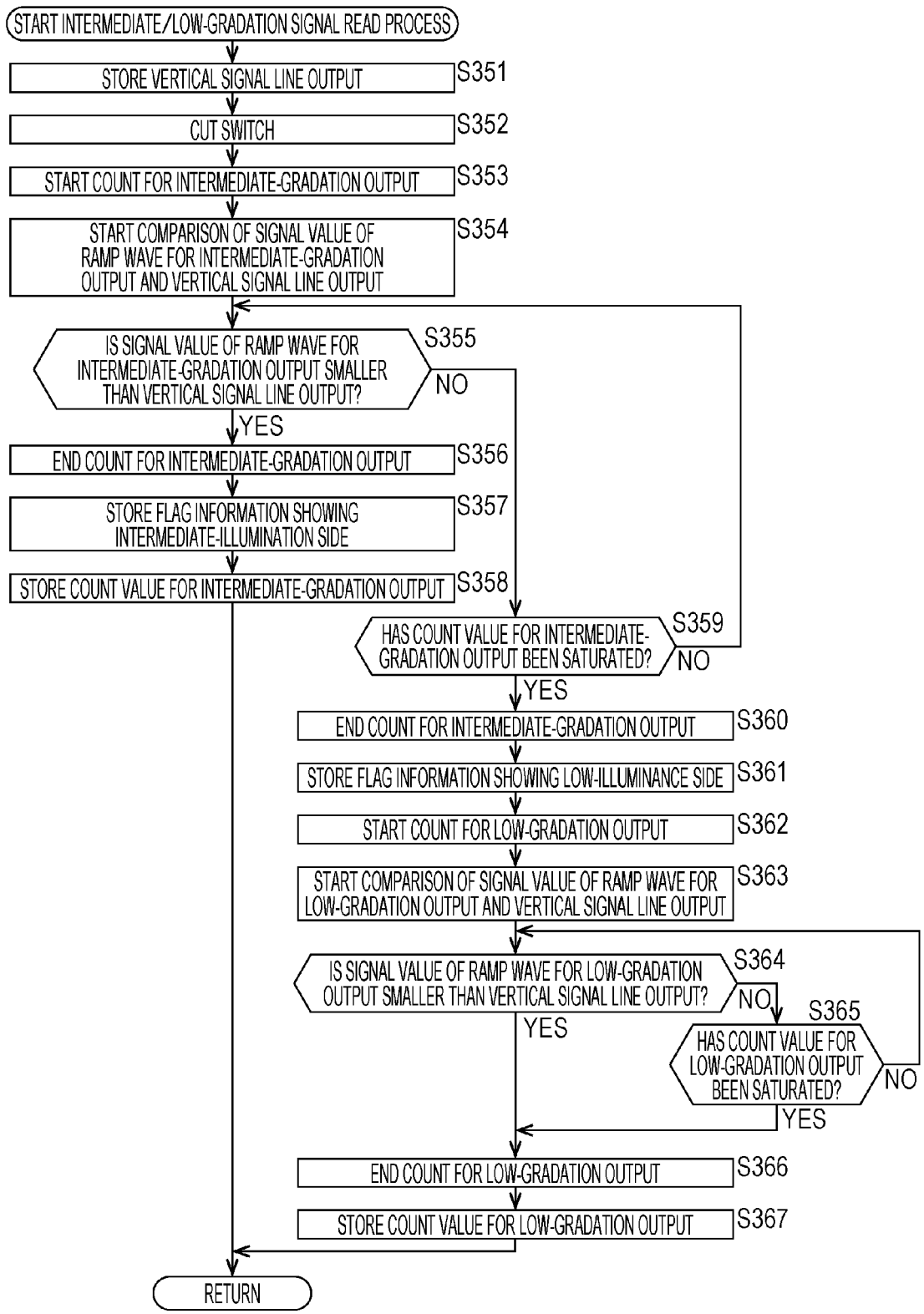
FIG. 20 is a flowchart showing an example of a flow of an intermediate/low-gradation signal read process.

Next, an example of a flow of the intermediate/low-gradation signal read process executed in step S304 of FIG. 18 will be described with reference to the flowchart of FIG. 20.

If the intermediate/low-gradation signal read process starts, in step S351, the capacitor 172 stores the vertical signal line output (pixel signal level of the attention pixel). During a period until the A/D conversion of the pixel signal starts after step S351 ends, in step S352, the switch 171 becomes a cutting state (turned off) and electrically cuts the vertical signal line 108 and the capacitor 161.

In step S353, the U/D counter 165 starts the count for the intermediate-gradation output. In step S354, the comparator 163 starts a comparison of the signal value of the ramp wave for the intermediate-gradation output and the vertical signal line output (pixel signal level of the attention pixel).

In step S355, the comparator 163 determines whether the signal value of the ramp wave for the intermediate-gradation output is smaller than the vertical signal line output. When it is determined that the signal value of the ramp wave for the intermediate-gradation output is smaller than the vertical signal line output, the comparator 163 makes the process proceed to step S356.

In step S356, the U/D counter 165 ends the count for the intermediate-gradation output. In step S357, the U/D counter 165 sets the flag information showing the intermediate-illuminance side and stores the flag information. In step S358, the U/D counter 165 stores the count value for the intermediate-gradation output when the count has ended in step S356. If the process of step S358 ends, the U/D counter 165 ends the intermediate/low-gradation signal read process and returns the process to FIG. 18.

In addition, when it is determined in step S355 that the signal value of the ramp wave for the intermediate-gradation output is not smaller than the vertical signal line output, the comparator 163 makes the process proceed to step S359.

In step S359, the comparator 163 determines whether the count value for the intermediate-gradation output has been saturated. When it is determined that the count value for the intermediate-gradation output has not been saturated, the comparator 163 returns the process to step S355 and repeats subsequent processes.

In addition, when it is determined in step S359 that the count value for the intermediate-gradation output has been saturated, the comparator 163 makes the process proceed to step S360.

In step S360, the U/D counter 165 ends the count for the intermediate-gradation output. In step S361, the U/D counter 165 sets the flag information showing the high-illuminance side and stores the flag information.

If the process of step S361 ends, in step S362, the U/D counter 165 starts the count for the low-gradation output. In step S363, the comparator 163 starts a comparison of the signal value of the ramp wave for the low-gradation output and the vertical signal line output (pixel signal level of the attention pixel).

In step S364, the comparator 163 determines whether the signal value of the ramp wave for the low-gradation output is smaller than the vertical signal line output. When it is determined that the signal value of the ramp wave for the low-gradation output is smaller than the vertical signal line output, the comparator 163 makes the process proceed to step S366.

In addition, when it is determined in step S364 that the signal value of the ramp wave for the low-gradation output is not smaller than the vertical signal line output, the comparator 163 makes the process proceed to step S365.

In step S365, the comparator 163 determines whether the count value for the low-gradation output has been saturated. When it is determined that the count value for the low-gradation output has not been saturated, the comparator 163 returns the process to step S364 and repeats subsequent processes.

In addition, when it is determined in step S365 that the count value for the low-gradation output has been saturated, the comparator 163 makes the process proceed to step S366.

In step S366, the U/D counter 165 ends the count for the low-gradation output. In step S367, the U/D counter 165 stores the count value for the low-gradation output when the count has ended in step S366. If the process of step S367 ends, the U/D counter 165 ends the intermediate/low-gradation signal read process and returns the process to FIG. 18.

As described above, each process is executed, so that the CMOS image sensor 100 can decrease the consumption power or the area of the column ADC 140.

[A/D Converting Unit Parallel Configuration]

In the above description, the plurality of A/D converting units executing the A/D conversions of the different gradations are provided as the column ADC 140 for one vertical signal line, but the number of A/D converting units of each gradation is one. However, the number of A/D converting units of each gradation is arbitrary. For example, a plurality of A/D converting units executing A/D conversions using the same reference signals (ramp waves having the same inclinations) may be provided.

Figure 21:
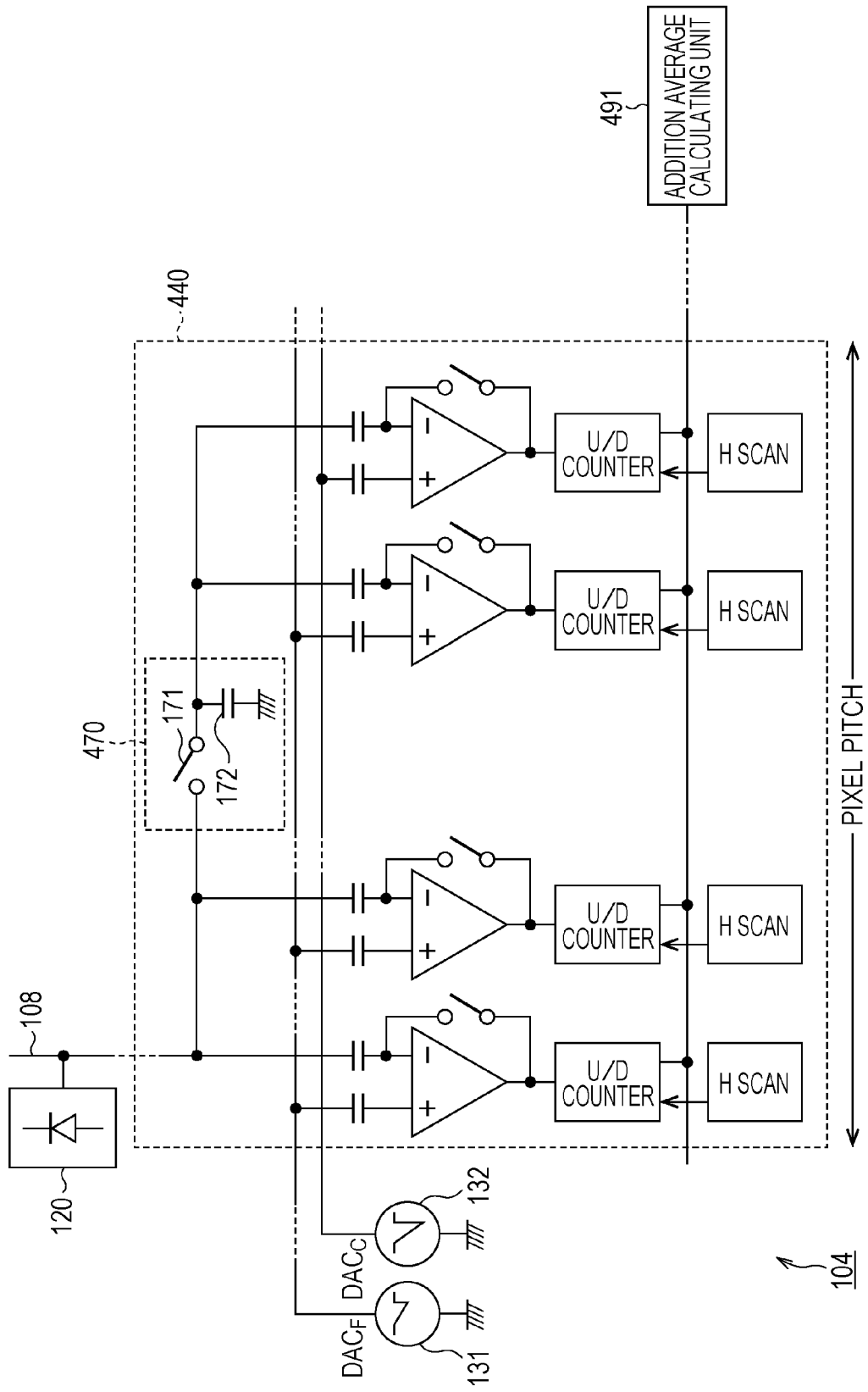
FIG. 21 is a circuit diagram showing another configuration example of column A/D.

FIG. 21 is a block diagram showing a main configuration example of a column ADC in that case.

A column ADC 440 shown in FIG. 21 is basically the same processing unit as the column ADC 140 described above with reference to FIG. 5. However, the column ADC 440 has two A/D converting units (in the drawing, two columns of a left side) operating in parallel as A/D converting units for a high gradation and has two A/D converting units (in the drawing, two columns of a right side) operating in parallel as A/D converting units for a low gradation, as shown in FIG. 21.

That is, the A/D converting units of the two columns of the left side in the column ADC 440 execute the A/D conversion using the reference signal (ramp wave having the most moderate inclination) for the high-gradation A/D conversion generated by the reference signal generation circuit 131. In addition, the A/D converting units of the two columns of the right side in the column ADC 440 execute the A/D conversion using the reference signal (ramp wave having the rapid inclination) for the low-gradation A/D conversion generated by the reference signal generation circuit 132.

As such, the plurality of A/D converting units are operated in parallel, the plurality of signals of the same gradations are acquired, the plurality of signals are averaged by a signal process (for example, an addition average calculating unit 491 of FIG. 21) of a rear step, and one digital data is obtained. In this way, random noise can be suppressed and an image signal with high precision can be acquired.

For example, if the two signals are generated using the two A/D converting units as described above and the signals are averaged, the random noise can be made to become $1/\sqrt{2}$ of the original noise and an S/N ratio can be improved by 3 dB.

The number of A/D converting units operated in parallel is arbitrary and may be three or more. In addition, the number of A/D converting units is set independently for each gradation. Therefore, the number of A/D converting units of each gradation may be the same or may be different.

The imaging element (imaging apparatus) to which the present technique is applied is limited to the above-described configuration and may have other configurations.

For example, the plurality of reference signal generation circuits of the column ADC that generate the reference signals of the ramp waveforms having the different inclinations may be provided and the number thereof may be three or more. In the column ADC, at least one A/D converting unit that executes the A/D conversion on the basis of each reference signal is provided for each vertical signal line. That is, in the column ADC, A/D conversions of gradations of kinds of the same number as the number of reference signal generation circuits are executed for each vertical signal line. In this case, the A/D conversions of the individual gradations can be executed in parallel.

The sample-and-hold unit 170 may be provided for each gradation and may be provided only between the A/D converting units other than the A/D converting unit that executes the A/D conversion of the highest gradation and the vertical signal line 108, similar to the case of FIG. 5.

In addition, the reference signal generation circuit may be provided outside the column ADC as long as the generated reference signal is supplied to each A/D converting unit in the column ADC as described above and may be provided outside the CMOS image sensor 100.

2. Second Embodiment

Imaging Apparatus

Figure 22:
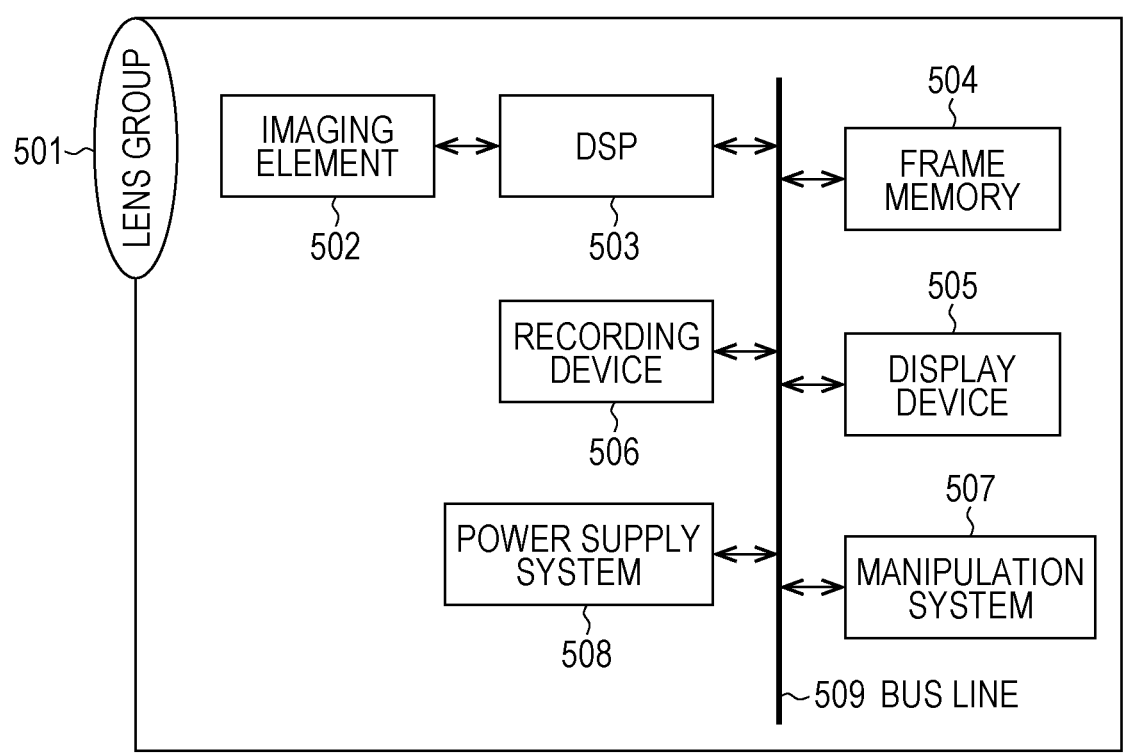
FIG. 22 is a block diagram showing a typical example structure of an imaging apparatus to which the present technique is applied.

FIG. 22 is a diagram showing a main configuration example of an imaging apparatus to which the present technique is applied. An imaging apparatus 500 shown in FIG. 22 is an apparatus that images an object and outputs an image of the object as an electrical signal. As shown in FIG. 22, the imaging apparatus 500 has an optical system including a lens group 501, an imaging element 502, a digital signal processor (DSP) 503 which is a camera signal processing unit, a frame memory 504, a display device 505, a recording device 506, a manipulation system 507, and a power supply system 508. In addition, the DSP 503, the frame memory 504, the display device 505, the recording device 506, the manipulation system 507, and the power supply system 508 are connected mutually through a bus line 509.

The lens group 501 captures incident light (image light) from the object and forms an image on an imaging surface of the imaging element 502. The imaging element 502 converts a light amount of the incident light, which has formed the image on the imaging surface by the lens group 501, into an electrical signal in a pixel unit and outputs the electrical signal as a pixel signal. As the imaging element 502, a solid-state imaging apparatus such as the CMOS image sensor 100 according to the above-described embodiment can be used. The DSP 503 executes a known camera signal process.

The display device 505 is composed of a liquid crystal display device or an organic electro luminescence (EL) display device and displays a moving image or a still image imaged by the imaging element 502. The recording device 506 records the moving image or the still image imaged by the imaging element 502 on a recording medium such as a video tape or a digital versatile disc (DVD).

The manipulation system 507 outputs manipulation commands for various functions of this imaging apparatus, under a manipulation by a user. The power supply system 508 appropriately supplies power from various power supplies becoming operation power supplies of the DSP 503, the frame memory 504, the display device 505, the recording device 506, and the manipulation system 507 to supply targets.

The imaging apparatus 500 is applied to a video camera, a digital still camera, and a camera module for a mobile apparatus such as a mobile phone. The above-described CMOS image sensor 100 is used as the imaging element 502, so that the imaging apparatus 500 can decrease generation of noise due to the kickback and can obtain an imaging image of a higher image quality.

The imaging apparatus including the imaging element and the image processing unit to which the present technique is applied is not limited to the above-described configuration and may have other configurations.

3. Third Embodiment

Computer

The above described series of processes can be performed by hardware, and can also be performed by software. When the series of processes are to be performed by software, the programs forming the software are installed into a computer. Here, the computer includes a computer embedded in dedicated hardware such as the system control unit 106 of FIG. 3 and a general-purpose computer that can execute various functions by installing various programs.

Figure 23:
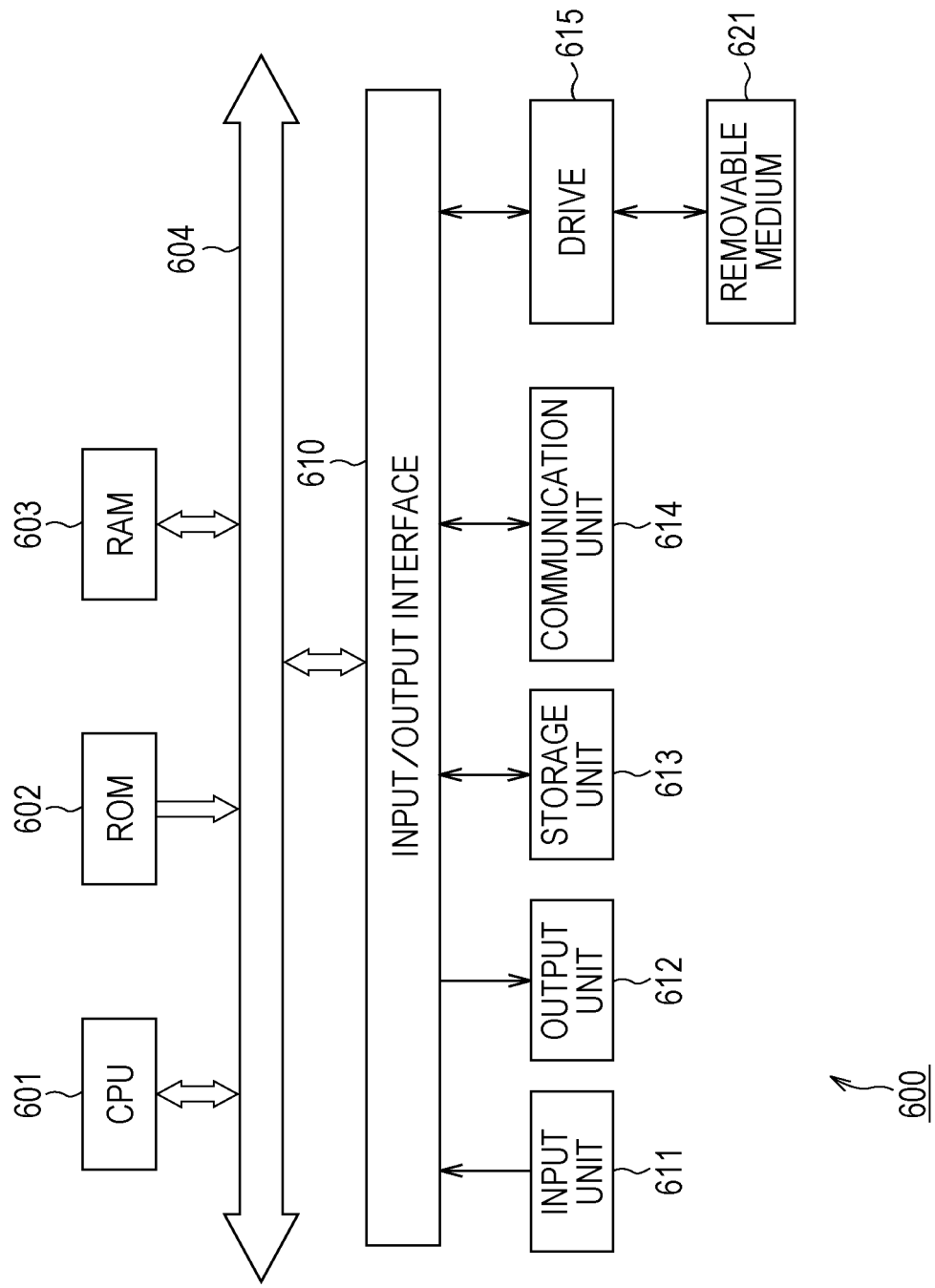
FIG. 23 is a block diagram showing a typical example structure of a computer.

FIG. 23 is a diagram showing a main configuration example of the general-purpose computer. In FIG. 23, a central processing unit (CPU) 601 of a general-purpose computer 600 executes various processes according to a program stored in a read only memory (ROM) 602 or a program loaded from a storage unit 613 to a random access memory (RAM) 603. Necessary data for the CPU 601 to perform various kinds of operations and the like are also stored in the RAM 603, where necessary.

The CPU 601, the ROM 602, and the RAM 603 are connected to one another via a bus 604. An input/output interface 610 is also connected to the bus 604.

The input/output interface 610 has the following components connected thereto: an input unit 611 formed with a keyboard, a mouse, or the like; an output unit 612 formed with a display such as a CRT (Cathode Ray Tube) or a LCD (Liquid Crystal Display), and a speaker; the storage unit 613 formed with a hard disk or the like; and a communication unit 614 formed with a modem. The communication unit 614 performs communications via networks including the Internet.

A drive 615 is also connected to the input/output interface 610 where necessary, and a removable medium 621 such as a magnetic disk, an optical disk, a magnetooptical disk, or a semiconductor memory is mounted on the drive as appropriate. A computer program read from such a removable disk is installed in the storage unit 613 where necessary.

When the above described series of processes is performed by software, the programs constituting the software are installed from a network or a recording medium.

As shown in FIG. 23, this recording medium is formed with the removable medium 621 that is distributed for delivering the program to users separately from the device, such as a magnetic disk (including a flexible disk), an optical disk (including a CD-ROM (Compact Disc-Read Only Memory) or a DVD (Digital Versatile Disc)), a magnetooptical disk (including an MD (Mini Disc)), or a semiconductor memory, which has the program recorded thereon. Alternatively, the recording medium may be formed with the ROM 602 having the program recorded therein or a hard disk included in the storage unit 613. Such a recording medium is incorporated beforehand into the device prior to the delivery to users.

The programs to be executed by the computer may be programs for performing processes in chronological order in accordance with the sequence described in this specification, or may be programs for performing processes in parallel or performing a process when necessary, such as when there is a call.

In this specification, steps describing programs to be recorded in a recording medium include processes to be performed in parallel or independently of one another if not necessarily in chronological order, as well as processes to be performed in chronological order in accordance with the sequence described herein.

In this specification, a system refers to the entirety of equipment including more than one device.

Furthermore, any structure described above as one device (or one processing unit) may be divided into two or more devices (or processing units). Conversely, any structure described above as two or more devices (or processing units) may be combined into one device (or processing unit). Furthermore, it is of course possible to add components other than those described above to the structure of any of the devices (or processing units). Furthermore, some components of a device (or processing unit) may be incorporated into the structure of another device (or processing unit) as long as the structure and the function of the system as a whole are substantially the same. That is, the present technique is not limited to the embodiments described above, but various modifications may be made thereto without departing from the scope of the technique.

The present technique can also be in the following forms.

(1) An imaging element including:

a plurality of comparing units that compare analog signals supplied from pixels including photoelectric conversion elements through a vertical signal line with reference signals of ramp waves having different inclinations and output comparison results;

a plurality of counters that execute counts until the comparison results are inverted for the different comparing units and output count values as digital data; and a sample-and-hold unit that holds the analog signals supplied through the vertical signal line before the comparing units comparing the analog signals and the reference signals of the ramp waves other than the ramp wave having the most moderate inclination start the comparisons and electrically cuts the vertical signal line and the comparing units and supplies the held analog signals to the comparing units while the comparing units execute the comparisons.

(2) The imaging element according to (1), wherein a voltage range of the ramp wave having the most moderate inclination is operated in a range in which kT/C noise is most dominant in the entire noise.

(3) The imaging element according to (2), wherein a counter that is selected from the plurality of counters on the basis of a comparison result of each comparing unit and executes a count for the comparing unit comparing the analog signal with a reference signal corresponding to an illuminance region according to a signal level of the analog signal outputs the count value.

(4) The imaging element according to (3), wherein a counter in which a count value is largest and the comparison result of the comparing unit to which the counter corresponds is inverted is selected from the plurality of counters.

(5) The imaging element according to (4), wherein flag information showing a voltage range of a reference signal used by the comparator to which the selected counter corresponds is output together with the count value.

(6) The imaging element according to any one of (1) to (5), wherein the sample-and-hold unit includes a switch that electrically connects or cuts the vertical signal line and the comparing units and a capacitor that holds the analog signals supplied through the vertical signal line while the vertical signal line and the comparing units are electrically connected by the switch and supplies the analog signals held by the capacitor to the comparing units while the vertical signal line and the comparing units are electrically cut by the switch.

(7) The imaging element according to any one of (1) to (6), further including:

a plurality of reference signal generating units that generate the reference signals of the ramp waves having the different inclinations, wherein the plurality of comparing units compare the analog signals with the reference signals generated by the different reference signal generating units.

(8) The imaging element according to (7),
wherein the plurality of reference signal generating units start generation of the reference signals at the same timing.

(9) The imaging element according to (7),
wherein, at timing when voltage values of the ramp wave having the most moderate inclination and the ramp waves having other inclinations do not cross after the reference signal generating unit generating the reference signal of the ramp wave having the most moderate inclination generates the reference signal, the reference signal generating units generating the reference signals of the ramp waves having other inclinations start generation of the reference signals.

(10) The imaging element according to (7),
wherein, at timing before the reference signal generating unit generating the reference signal of the ramp wave having the most moderate inclination generates the reference signal, the reference signal generating units generating the reference signals of the ramp waves having other inclinations start generation of the reference signals.

(11) The imaging element according to (7),
wherein, while the reference signal generating unit generating the reference signal of the ramp wave having the most moderate inclination generates the reference signal, the reference signal generating units generating the reference signals of the ramp waves having other inclinations sequentially generate the reference signals of the ramp waves having the different inclinations.

(12) The imaging element according to any one of (1) to (11),
wherein a part or all of the plurality of comparing units compare the analog signals with the reference signals of the ramp waves having the same inclination, and
the imaging element further includes an addition average unit that averages the count values output by the counters corresponding to the plurality of comparing units comparing the analog signals with the reference signals of the ramp waves having the same inclination.

(13) A control method of an imaging element, including:
causing a plurality of comparing units to compare analog signals supplied from pixels including photoelectric conversion elements through a vertical signal line with reference signals of ramp waves having different inclinations and output comparison results;
causing a plurality of counters to execute counts until the comparison results are inverted for the different comparing units and output count values as digital data; and
causing a sample-and-hold unit to hold the analog signals supplied through the vertical signal line before the comparing units comparing the analog signals and the reference signals of the ramp waves other than the ramp wave having the most moderate inclination start the comparisons and electrically cut the vertical signal line and the comparing units and supply the held analog signals to the comparing units while the comparing units execute the comparisons.

(14) An imaging apparatus including:
an imaging element having a plurality of comparing units that compare analog signals supplied from pixels including photoelectric conversion elements through a vertical signal line with reference signals of ramp waves having different inclinations and output comparison results, a plurality of counters that execute counts until the comparison results are inverted for the different comparing units and output count values as digital data, and a sample-and-hold unit that holds the analog signals supplied through the vertical signal line before the comparing units comparing the analog signals and the reference signals of the ramp waves other than the ramp wave having the most moderate inclination start the comparisons and electrically cuts the vertical signal line and the comparing units and supplies the held analog signals to the comparing units while the comparing units execute the comparisons;
an image processing unit that executes image processing on digital data of an imaging image output from the imaging element; and
a storage unit that stores the digital data of the imaging image subjected to the image processing by the image processing unit.

(15) An imaging element including:
a plurality of reference signal generating units that generate reference signals of ramp waves having different inclinations at different timings;
a plurality of comparing units that compare analog signals supplied from pixels including photoelectric conversion elements through a vertical signal line with the reference signals generated by the different reference signal generating units and output comparison results; and
a plurality of counters that execute counts until the comparison results are inverted for the different comparing units and output count values as digital data.

(16) The imaging element according to (15),
wherein, at timing when voltage values of the ramp wave having the most moderate inclination and the ramp waves having other inclinations do not cross after the reference signal generating unit generating the reference signal of the ramp wave having the most moderate inclination generates the reference signal, the reference signal generating units generating the reference signals of the ramp waves having other inclinations start generation of the reference signals.

(17) The imaging element according to (15),
wherein, at timing before the reference signal generating unit generating the reference signal of the ramp wave having the most moderate inclination generates the reference signal, the reference signal generating units generating the reference signals of the ramp waves having other inclinations start generation of the reference signals.

(18) The imaging element according to (15),
wherein flag information showing a voltage range of a reference signal used by the comparator to which a selected counter corresponds is output together with the count value.

(19) A control method of an imaging element, including:
causing a plurality of reference signal generating units to generate reference signals of ramp waves having different inclinations at different timings;
causing a plurality of comparing units to compare analog signals supplied from pixels including photoelectric conversion elements through a vertical signal line with the reference signals generated by the different reference signal generating units and output comparison results; and
causing a plurality of counters to execute counts until the comparison results are inverted for the different comparing units and output count values as digital data.

(20) An imaging apparatus including:
an imaging element having a plurality of reference signal generating units that generate reference signals of ramp waves having different inclinations at different timings, a plurality of comparing units that compare analog signals supplied from pixels including photoelectric conversion elements through a vertical signal line with the reference signals generated by the different reference signal generating units and output comparison results, and a plurality of counters that execute counts until the comparison results are inverted for the different comparing units and output count values as digital data;

an image processing unit that executes image processing on digital data of an imaging image output from the imaging element; and a storage unit that stores the digital data of the imaging image subjected to the image processing by the image processing unit.

REFERENCE SIGNS LIST

100 CMOS image sensor
101 Semiconductor substrate
102 Pixel array unit
103 Row scanning unit
104 Column processing unit
105 Column scanning unit
106 System control unit
107 Pixel driving line
108 Vertical signal line
109 Horizontal bus
110 Output terminal
120 Pixel
131, 132 Reference signal generation circuit
140 Column ADC
153 Comparator
155 U/D counter
163 Comparator
165 U/D counter
170 Sample-and-hold unit
171 Switch
172 Capacitor
440 Column ADC
470 Sample-and-hold unit
491 Addition average calculating unit
500 Imaging apparatus
600 Computer

The invention claimed is:

1. An imaging element comprising:
   comparing units that compare analog signals supplied from pixels including photoelectric conversion elements through a vertical signal line with reference signals of ramp waves having different inclinations and output comparison results;
   counters that execute counts until the comparison results are inverted for the different comparing units and output count values as digital data; and
   a sample-and-hold unit that holds the analog signals supplied through the vertical signal line before one of the comparing units compares one of the analog signals and one of the reference signals of the ramp waves, wherein
      said one of the reference signals has the steepest inclination of the reference signals, and
      the comparing units start the comparisons and the sample-and-hold unit electrically disconnects the vertical signal line from said one of the comparing units and supplies the held analog signals to the said one of the comparing units while the comparing units execute the comparisons.

2. The imaging element according to claim 1, wherein a voltage range of another reference signal having a less steep inclination than said one of the reference signals is operated in a range in which kT/C noise is most dominant in entire noise.

3. The imaging element according to claim 2, wherein a counter that is selected from the plurality of counters on the basis of a comparison result of each comparing unit and executes a count for the comparing unit comparing the analog signal with a reference signal corresponding to an illuminance region according to a signal level of the analog signal outputs the count value.

4. The imaging element according to claim 3, wherein a counter in which a count value is largest and the comparison result of the comparing unit to which the counter corresponds is inverted is selected from the plurality of counters.

5. The imaging element according to claim 4, wherein flag information showing a voltage range of a reference signal used by the comparator to which the selected counter corresponds is output together with the count value.

6. The imaging element according to claim 1, wherein the sample-and-hold unit includes a switch that electrically connects or disconnects the vertical signal line and the comparing units and a capacitor that holds the analog signals supplied through the vertical signal line while the vertical signal line and the comparing units are electrically connected by the switch and supplies the analog signals held by the capacitor to the comparing units while the vertical signal line and the comparing units are electrically disconnected by the switch.

7. The imaging element according to claim 1, further comprising:
   reference signal generating units that generate the reference signals of the ramp waves having the different inclinations, wherein
   comparing units compare the analog signals with the reference signals generated by the different reference signal generating units.

8. The imaging element according to claim 7, wherein the plurality of reference signal generating units start generation of the reference signals at the same timing.

9. The imaging element according to claim 7, wherein, at timing when voltage values of the ramp wave having a less steep inclination than said one of the reference signals and the ramp waves having other inclinations do not cross after the reference signal generating unit generating the reference signal of the ramp wave having the most moderate inclination generates the reference signal, the reference signal generating units generating the reference signals of the ramp waves having other inclinations start generation of the reference signals.

10. The imaging element according to claim 7, wherein, at timing before the reference signal generating unit generating the reference signal of the ramp wave having a less steep inclination than said one of the reference signals generates the reference signal, the reference signal generating units generating the reference signals of the ramp waves having other inclinations start generation of the reference signals.

11. The imaging element according to claim 7, wherein, while the reference signal generating unit generating the reference signal of the ramp wave having a less steep inclination than said one of the reference signals generates the reference signal, the reference signal generating units generating the reference signals of the ramp waves having other inclinations sequentially generate the reference signals of the ramp waves having the different inclinations.

12. The imaging element according to claim 1, wherein
   a part or all of the plurality of comparing units compare the analog signals with the reference signals of the ramp waves having the same inclination, and
   the imaging element further comprises an addition average unit that averages the count values output by the counters corresponding to the plurality of comparing units comparing the analog signals with the reference signals of the ramp waves having the same inclination.

13. A control method of an imaging element, comprising:
causing comparing units to compare analog signals supplied from pixels including photoelectric conversion elements through a vertical signal line with reference signals of ramp waves having different inclinations and output comparison results;
causing counters to execute counts until the comparison results are inverted for the different comparing units and output count values as digital data; and
causing a sample-and-hold unit to hold the analog signals supplied through the vertical signal line before one of the comparing units compares one of the analog signals and one of the reference signals of the ramp waves, wherein said one of the reference signals has the steepest inclination of the reference signals, and
the comparing units start the comparisons and the sample-and-hold unit electrically disconnects the vertical signal line from the said one of the comparing units and supplies the held analog signals to the said one of the comparing units while the comparing units execute the comparisons.

14. An imaging apparatus comprising:
an imaging element having comparing units that compare analog signals supplied from pixels including photoelectric conversion elements through a vertical signal line with reference signals of ramp waves having different inclinations and output comparison results, a plurality of counters that execute counts until the comparison results are inverted for the different comparing units and output count values as digital data, and a sample-and-hold unit that holds the analog signals supplied through the vertical signal line before one of the comparing units compares one of the analog signals and one of the reference signals of the ramp waves;
an image processing unit that executes image processing on digital data of an imaging image output from the imaging element; and
a storage unit that stores the digital data of the imaging image subjected to the image processing by the image processing unit, wherein
said one of the reference signals has the steepest inclination of the reference signals, and
the comparing units start the comparisons and the sample-and-hold unit electrically disconnects the vertical signal line from the said one of the comparing units and supplies the held analog signals to the comparing units while the said one of the comparing units execute the comparisons.

15. An imaging element comprising:
reference signal generating units that generate reference signals of ramp waves having different inclinations at different timings;
comparing units that compare analog signals supplied from pixels including photoelectric conversion elements through a vertical signal line with the reference signals generated by the different reference signal generating units and output comparison results; and
counters that execute counts until the comparison results are inverted for the different comparing units and output count values as digital data, wherein
at timing when voltage values of the ramp wave having the gradual inclination and the ramp waves having other inclinations do not cross after the reference signal generating unit generating the reference signal of the ramp wave having a less steep inclination than said one of the reference signals generates the reference signal, the reference signal generating units generating the reference signals of the ramp waves having other inclinations start generation of the reference signals.

16. The imaging element according to claim 15, wherein, at timing before the reference signal generating unit generating the reference signal of the ramp wave having the gradual inclination generates the reference signal, the reference signal generating units generating the reference signals of the ramp waves having other inclinations start generation of the reference signals.

17. The imaging element according to claim 15, wherein flag information showing a voltage range of a reference signal used by the comparator to which a selected counter corresponds is output together with the count value.

18. A control method of an imaging element, comprising:
causing reference signal generating units to generate reference signals of ramp waves having different inclinations at different timings;
causing comparing units to compare analog signals supplied from pixels including photoelectric conversion elements through a vertical signal line with the reference signals generated by the different reference signal generating units and output comparison results; and
causing counters to execute counts until the comparison results are inverted for the different comparing units and output count values as digital data, wherein
at timing when voltage values of the ramp wave having the gradual inclination and the ramp waves having other inclinations do not cross after the reference signal generating unit generating the reference signal of the ramp wave having a less steep inclination than said one of the reference signals generates the reference signal, the reference signal generating units generating the reference signals of the ramp waves having other inclinations start generation of the reference signals.

19. An imaging apparatus comprising:
an imaging element having reference signal generating units that generate reference signals of ramp waves having different inclinations at different timings, a plurality of comparing units that compare analog signals supplied from pixels including photoelectric conversion elements through a vertical signal line with the reference signals generated by the different reference signal generating units and output comparison results, and a plurality of counters that execute counts until the comparison results are inverted for the different comparing units and output count values as digital data;
an image processing unit that executes image processing on digital data of an imaging image output from the imaging element; and
a storage unit that stores the digital data of the imaging image subjected to the image processing by the image processing unit, wherein
at timing when voltage values of the ramp wave having the gradual inclination and the ramp waves having other inclinations do not cross after the reference signal generating unit generating the reference signal of the ramp wave having a less steep inclination than said one of the reference signals generates the reference signal, the reference signal generating units generating the reference signals of the ramp waves having other inclinations start generation of the reference signals.

* * * * *